US012625089B2

(12) United States Patent
Short, Jr. et al.

(10) Patent No.: US 12,625,089 B2
(45) Date of Patent: May 12, 2026

(54) RF-BASED SPECIAL MATERIAL DETECTION SYSTEM WITH SECURE MULTI-DIMENSIONAL AUTHENTICATION

(71) Applicant: QUANTUM IP, LLC, Stuart, FL (US)

(72) Inventors: Robert J. Short, Jr., Stuart, FL (US); Lee Duke, Stuart, FL (US); John Cronin, Stuart, FL (US); Michael D'Andrea, Stuart, FL (US); Harrison Grant, Stuart, FL (US)

(73) Assignee: QUANTUM IP, LLC, Stuart, FL (US)

( * ) Notice: Subject to any disclaimer, the term of this patent is extended or adjusted under 35 U.S.C. 154(b) by 0 days.

(21) Appl. No.: 19/279,049

(22) Filed: Jul. 24, 2025

(65) Prior Publication Data

US 2026/0009741 A1    Jan. 8, 2026

Related U.S. Application Data

(63) Continuation of application No. 18/936,500, filed on Nov. 4, 2024, now Pat. No. 12,372,480.

(Continued)

(51) Int. Cl.
*G01N 22/00* (2006.01)
*G01R 23/07* (2006.01)
(Continued)

(52) U.S. Cl.
CPC ............. *G01N 22/00* (2013.01); *G01R 23/07* (2013.01); *G01R 27/26* (2013.01); *G06V 40/172* (2022.01);
(Continued)

(58) Field of Classification Search
CPC ............. G01N 22/00; G01N 2291/014; G06V 40/172; G01R 23/07; G01R 27/26; H03J 2200/00
(Continued)

(56) References Cited

U.S. PATENT DOCUMENTS 2,116,717 A    5/1938    Hans
3,725,917 A    4/1973    Sletten et al.
(Continued)

FOREIGN PATENT DOCUMENTS

CN    107102325    8/2017
CN    117091456    11/2023
(Continued)

OTHER PUBLICATIONS

U.S. Appl. No. 18/921,840, Robert J. Short Jr., Based Material Detection Device That Uses Specific Antennas Designed for Specific Substances, filed Oct. 21, 2024.
(Continued)

*Primary Examiner* — Raul J Rios Russo

(74) *Attorney, Agent, or Firm* — Polsinelli LLP

(57)    ABSTRACT

A method includes accessing a material database associating each of a plurality of materials with one or more corresponding resonance frequencies; for each material of at least a subset of the plurality of materials in the material database: transmitting, via an RF transmitter, an RF signal into a target at a first resonance frequency for each material; receiving, via an RF receiver, a response signal from the target; and analyzing the response signal for resonance characteristics that indicate a presence of each material in the target; generating a report of each material in the target indicated by the resonance characteristics; and integrating the report with at least one of: a timestamp; image or video data from a camera; or geolocation data from a geolocation sensor.

20 Claims, 4 Drawing Sheets

Related U.S. Application Data

(60) Provisional application No. 63/668,633, filed on Jul. 8, 2024.

(51) Int. Cl.
    *G01R 27/26*        (2006.01)
    *G06V 40/16*        (2022.01)

(52) U.S. Cl.
    CPC .... *G01N 2291/014* (2013.01); *H03J 2200/00* (2013.01)

(58) Field of Classification Search
    USPC ........................................................ 324/633
    See application file for complete search history.

(56)                    References Cited

U.S. PATENT DOCUMENTS

| | | | |
|---|---|---|---|
| 3,851,971 | A | 12/1974 | Koch |
| 3,983,558 | A | 9/1976 | Rittenbach |
| 4,132,943 | A | 1/1979 | Gournay et al. |
| 4,217,585 | A | 8/1980 | Fishbein et al. |
| 4,296,378 | A | 10/1981 | King |
| 4,514,691 | A | 4/1985 | De Los Santos et al. |
| 4,897,660 | A | 1/1990 | Gold et al. |
| 5,227,800 | A | 7/1993 | Huguenin et al. |
| 5,233,300 | A | 8/1993 | Buess et al. |
| 5,592,083 | A | 1/1997 | Magnuson et al. |
| 5,745,071 | A | 4/1998 | Blackmon et al. |
| 6,297,765 | B1 | 10/2001 | Frazier et al. |
| 6,359,582 | B1 | 3/2002 | MacAleese et al. |
| 6,900,633 | B2 | 5/2005 | Sauer et al. |
| 6,967,612 | B1 | 11/2005 | Gorman et al. |
| 7,251,310 | B2 | 7/2007 | Smith |
| 7,288,927 | B2 | 10/2007 | Nutting et al. |
| 7,405,692 | B2 | 7/2008 | McMakin et al. |
| 7,825,648 | B2 | 11/2010 | Nutting et al. |
| 8,138,770 | B2 | 3/2012 | Pechmann et al. |
| 8,188,862 | B1 | 5/2012 | Tam et al. |
| 8,242,447 | B1 | 8/2012 | Chawla |
| 8,242,450 | B2 | 8/2012 | Gaziano |
| 8,502,666 | B1 | 8/2013 | Tam et al. |
| 8,773,127 | B2 | 7/2014 | Apostolos et al. |
| 8,890,745 | B2 | 11/2014 | Wahlquist et al. |
| 9,182,481 | B2 | 11/2015 | Bowring et al. |
| 9,500,609 | B1 | 11/2016 | Zank |
| 9,915,727 | B1 | 3/2018 | Reznack et al. |
| 10,204,775 | B2 | 2/2019 | Brown et al. |
| 10,229,328 | B2 | 3/2019 | Nikolova et al. |
| 10,268,889 | B2 | 4/2019 | Brown et al. |
| 10,816,658 | B2 | 10/2020 | Frizzell |
| 10,890,656 | B2 | 1/2021 | Heinen |
| 11,280,898 | B2 | 3/2022 | Morton |
| 11,422,252 | B2 | 8/2022 | Bowring et al. |
| 11,493,494 | B2 | 11/2022 | Wilson et al. |
| 12,248,062 | B1 | 3/2025 | Short et al. |
| 12,360,234 | B1 | 7/2025 | Short et al. |
| 12,372,480 | B1 | 7/2025 | Short et al. |
| 12,379,439 | B1 | 8/2025 | Short et al. |
| 12,386,037 | B1 | 8/2025 | Short et al. |
| 12,451,217 | B1 | 10/2025 | Short, Jr. et al. |
| 12,455,332 | B1 | 10/2025 | Short, Jr. et al. |
| 12,517,066 | B1 | 1/2026 | Short, Jr. et al. |
| 2002/0008655 | A1 | 1/2002 | Haj-Yousef |
| 2003/0196543 | A1 | 10/2003 | Moser et al. |
| 2004/0039713 | A1 | 2/2004 | Beck |
| 2004/0125020 | A1 | 7/2004 | Hendler et al. |
| 2004/0155650 | A1 | 8/2004 | Plaas-Link et al. |
| 2004/0232054 | A1 | 11/2004 | Brown et al. |
| 2004/0252062 | A1 | 12/2004 | Tracy et al. |
| 2005/0081634 | A1 | 4/2005 | Matsuzawa |
| 2005/0200528 | A1 | 9/2005 | Carrender et al. |
| 2005/0230604 | A1 | 10/2005 | Rowe et al. |
| 2005/0258235 | A1 | 11/2005 | Silverbrook et al. |
| 2006/0008051 | A1 | 1/2006 | Heaton et al. |
| 2006/0038563 | A1* | 2/2006 | Chisholm ............ G01R 33/441 |
| | | | 324/309 |
| 2007/0074580 | A1 | 4/2007 | Fallah-Rad et al. |
| 2007/0115183 | A1 | 5/2007 | Kim et al. |
| 2007/0188377 | A1 | 8/2007 | Krikorian et al. |
| 2008/0283761 | A1 | 11/2008 | Robinson et al. |
| 2009/0085565 | A1 | 4/2009 | Fullerton |
| 2009/0085582 | A1 | 4/2009 | Sinha |
| 2009/0195435 | A1 | 8/2009 | Kapilevich et al. |
| 2009/0222446 | A1* | 9/2009 | Goldschmidt ......... G06V 10/42 |
| 2009/0262005 | A1 | 10/2009 | McNeill et al. |
| 2010/0046704 | A1 | 2/2010 | Song et al. |
| 2010/0079280 | A1 | 4/2010 | Lacaze et al. |
| 2010/0128852 | A1 | 5/2010 | Yamamoto et al. |
| 2010/0134102 | A1 | 6/2010 | Crowley |
| 2010/0134254 | A1* | 6/2010 | Kim ..................... G06K 19/067 |
| | | | 340/10.1 |
| 2010/0164831 | A1 | 7/2010 | Rentz et al. |
| 2010/0182594 | A1 | 7/2010 | Carron |
| 2011/0050241 | A1 | 3/2011 | Nutting et al. |
| 2011/0233419 | A1 | 9/2011 | Norris |
| 2011/0284742 | A1 | 11/2011 | Barker et al. |
| 2012/0206141 | A1 | 8/2012 | Apostolos et al. |
| 2012/0248313 | A1 | 10/2012 | Karam et al. |
| 2012/0256779 | A1 | 10/2012 | Nguyen et al. |
| 2014/0050372 | A1* | 2/2014 | Qi ........................ G06V 40/172 |
| | | | 382/118 |
| 2014/0154788 | A1 | 6/2014 | Omenetto et al. |
| 2015/0160181 | A1 | 6/2015 | White et al. |
| 2015/0250388 | A1 | 9/2015 | Arbabian et al. |
| 2016/0011307 | A1 | 1/2016 | Casse et al. |
| 2016/0047757 | A1 | 2/2016 | Kuznetsov et al. |
| 2016/0124071 | A1 | 5/2016 | Baxley et al. |
| 2016/0166843 | A1 | 6/2016 | Casse et al. |
| 2016/0178601 | A1 | 6/2016 | Harrison |
| 2016/0195608 | A1 | 7/2016 | Ruenz |
| 2016/0223666 | A1 | 8/2016 | Kim et al. |
| 2016/0274230 | A1 | 9/2016 | Wu et al. |
| 2016/0327634 | A1 | 11/2016 | Katz et al. |
| 2017/0011255 | A1 | 1/2017 | Kaditz et al. |
| 2017/0350834 | A1 | 12/2017 | Prado et al. |
| 2018/0067204 | A1 | 3/2018 | Frizzell |
| 2018/0285640 | A1* | 10/2018 | Brown .................. G01J 3/2823 |
| 2019/0137653 | A1 | 5/2019 | Starr et al. |
| 2019/0154439 | A1 | 5/2019 | Binder |
| 2019/0208112 | A1 | 7/2019 | Kleinbeck |
| 2019/0219687 | A1 | 7/2019 | Baheti et al. |
| 2019/0257771 | A1 | 8/2019 | Desmulliez et al. |
| 2020/0166634 | A1 | 5/2020 | Peleg |
| 2020/0173970 | A1 | 6/2020 | Wilson et al. |
| 2020/0264298 | A1 | 8/2020 | Haseltine et al. |
| 2020/0333412 | A1 | 10/2020 | Nichols et al. |
| 2020/0371227 | A1 | 11/2020 | Malhi |
| 2021/0041376 | A1 | 2/2021 | Ashiwal et al. |
| 2021/0096240 | A1 | 4/2021 | Padmanabhan et al. |
| 2021/0312201 | A1 | 10/2021 | Hastings et al. |
| 2021/0373098 | A1 | 12/2021 | Fraundorfer et al. |
| 2021/0389321 | A1* | 12/2021 | Kaushik ................. G01N 21/64 |
| 2022/0011401 | A1 | 1/2022 | Dolgin et al. |
| 2022/0171017 | A1 | 6/2022 | McFadden et al. |
| 2022/0265882 | A1 | 8/2022 | Lemchen |
| 2022/0311135 | A1 | 9/2022 | Guo et al. |
| 2022/0365168 | A1 | 11/2022 | Amizur et al. |
| 2022/0408643 | A1 | 12/2022 | Somarowthu et al. |
| 2023/0243761 | A1 | 8/2023 | Somarowthu et al. |
| 2023/0375695 | A1 | 11/2023 | Tan |
| 2024/0036166 | A1 | 2/2024 | Geng et al. |
| 2024/0372600 | A1 | 11/2024 | Schreck et al. |
| 2026/0009740 | A1 | 1/2026 | Short, Jr. et al. |
| 2026/0009893 | A1 | 1/2026 | Short, Jr. et al. |
| 2026/0009894 | A1 | 1/2026 | Short, Jr. et al. |
| 2026/0009895 | A1 | 1/2026 | Short, Jr. et al. |
| 2026/0009896 | A1 | 1/2026 | Short, Jr. et al. |
| 2026/0011201 | A1 | 1/2026 | Short, Jr. et al. |
| 2026/0011229 | A1 | 1/2026 | Short, Jr. et al. |

(56) References Cited

U.S. PATENT DOCUMENTS

| | | |
|---|---|---|
| 2026/0036658 A1 | 2/2026 | Short, Jr. et al. |
| 2026/0043900 A1 | 2/2026 | Short, Jr. et al. |

FOREIGN PATENT DOCUMENTS

| | | |
|---|---|---|
| EP | 2960685 A2 | 12/2015 |
| JP | 2014095625 | 5/2014 |
| WO | 2000075892 A2 | 12/2000 |
| WO | WO 2024091157 | 5/2024 |
| WO | PCT/US2024/039348 | 7/2024 |
| WO | PCT/US2025/03631 | 7/2025 |
| WO | PCT/US2025/036318 | 7/2025 |
| WO | PCT/US2025/036330 | 7/2025 |
| WO | 2026010635 A1 | 1/2026 |
| WO | 2026015361 A1 | 1/2026 |

OTHER PUBLICATIONS

U.S. Appl. No. 18/922,682, Robert J. Short Jr., Enhanced Antenna Materials For Low-Frequency Detection of Maerials, filed Oct. 22, 2024.

U.S. Appl. No. 18/922,693, Robert J. Dynamic Short Jr., Dynamic Phased Array Resonator Optimization System For Determiining a Material Substance, filed Oct. 22, 2024.

U.S. Appl. No. 18/923,518, Robert J. Short Jr., Currency RF Based Verification Device, filed Oct. 22, 2024.

U.S. Appl. No. 19/074,744, Robert J. Short Jr., Material Detection and Frequency Sweep Analysis of Controlled Substances Via Digital Signal Processing, filed Mar. 10, 2025.

U.S. Appl. No. 18/922,729, Robert J. Short Jr., RF Based Detection Device For Material Identification Using a Smart Frequency Selection Method, filed Oct. 22, 2024.

U.S. Appl. No. 18/929,189, Robert J. Short Jr., RF-Specific Material Detection Device For an Application-Specific Device, filed Oct. 28, 2024.

U.S. Appl. No. 19/268,204, Robert J. Short Jr., RF-Based Material Identification Systems and Methods, filed Jul. 14, 2025.

U.S. Appl. No. 18/934,569, Robert J. Short Jr., Networked RF Material Devices For Substance Detection Via Opposed Perimeter Sensors, filed Nov. 1, 2024.

U.S. Appl. No. 18/939,132, Robert J. Short Jr., RF Material Detection Device With Smart Scanning Multiple Axis Gimbal Integrated With Haptics, filed Nov. 6, 2024.

U.S. Appl. No. 18/938,584, Robert J. Short Jr., RF Transmit and Receiver Antenna Detector System, filed Nov. 6, 2024.

U.S. Appl. No. 18/936,177, Robert J. Short Jr., Method and System For Detecting and Quantifying Specific Substances, Elements, or Conditions Utilizing an AI Module, filed Nov. 4, 2024.

U.S. Appl. No. 18/942,906, Robert J. Short Jr., RF-Specific Material Detection Device Integrated Into Application-Specific Drone Device, filed Nov. 11, 2024.

U.S. Appl. No. 18/936,500, Robert J. Short Jr., RF-Based Special Material Detection System With Secure Multi-Dimensional Authentication, filed Nov. 4, 2024.

U.S. Appl. No. 18/938,691, Robert J. Short Jr., RF-Based AI Determination of Materials By Cycling Through Detection Patterns For Specific Applications, filed Nov. 6, 2024.

U.S. Appl. No. 18/946,014, Robert J. Short Jr., RF Based Special Material Detection Securing Entry Points and Access, filed Nov. 13, 2024.

PCT Application No. PCT/US2024/039348, International Search Report and Written Opinion dated Oct. 17, 2024.

U.S. Appl. No. 18/921,840, Non-Final Office Action dated Feb. 28, 2025.

U.S. Appl. No. 18/922,693, Non-Final Office Action dated Nov. 26, 2024.

U.S. Appl. No. 18/922,693, Final Office Action dated Mar. 17, 2025.

U.S. Appl. No. 18/922,693, Non-Final Office Action dated Jun. 4, 2025.

U.S. Appl. No. 18/922,729, Non-Final Office Action dated Dec. 16, 2024.

U.S. Appl. No. 18/929,189, Non-Final Office Action dated Jan. 24, 2025.

U.S. Appl. No. 18/929,189, Final Office Action dated Jun. 23, 2025.

U.S. Appl. No. 18/782,964, Non-Final Office Action dated Dec. 6, 2024.

U.S. Appl. No. 18/939,132, Non-Final Office Action dated Dec. 26, 2024.

U.S. Appl. No. 18/938,584, Non-Final Office Action dated Feb. 24, 2025.

U.S. Appl. No. 18/936,177, Non-Final Office Action dated Jan. 21, 2025.

U.S. Appl. No. 18/936,500, Non-Final Office Action dated Dec. 23, 2024.

U.S. Appl. No. 18/946,014, Non-Final Office Action dated Jan. 16, 2025.

Erricolo et al., "Machine Learning in Electromagnetics: A Review and Some Perspectives for Future Research," 2019 International Conference on Electromagnetics in Advanced Applications (ICEAA), Granada, Spain, 2019, pp. 1377-1380, doi: 10.1109/ICEAA.2019. 8879110.

Ibrahim et al., "A Subspace Signal Processing Technique for Concealed Weapons Detection," 2007 IEEE International Conference on Acoustics, Speech and Signal Processing—ICASSP '07, Honolulu, HI, USA, pp. II-401-II-404, doi: 10.1109/ICASSP.2007. 366257, 2007.

Itozaki et al., "Nuclear Quadrupole Resonance for Explosive Detection," International Journal on Smart Sensing and Intelligent Systems, vol. 1, No. 3, Sep. 2008.

U.S. Appl. No. 19/296,137, Robert J. Short Jr., RF Based Detection Device For Material Identification Using a Smart Frequency Selection Method, filed Aug. 11, 2025.

U.S. Appl. No. 19/290,051, Robert J. Short Jr., RF Material Detection Device With Smart Scanning Multiple Axis Gimbal Integrated With Haptics, filed Aug. 4, 2025.

U.S. Appl. No. 19/370,609, Robert J. Short Jr., FR Transmit and Receiver Antenna Detector System, filed Oct. 27, 2025.

U.S. Appl. No. 19/364,892, Robert J. Short Jr., Method and System For Detecting and Quantifying Specific Substances, Elements, or Conditions Utilizing an AI Module, filed Oct. 21, 2025.

PCT Application No. PCT/US2025/036318, International Search Report and Written Opinion dated Aug. 26, 2025.

U.S. Appl. No. 18/946,014, Final Office Action dated Sep. 10, 2025.

U.S. Appl. No. 18/923,518, Non-Final Office Action dated Nov. 19, 2025.

U.S. Appl. No. 19/268,204, Non-Final Office Action dated Aug. 13, 2025.

U.S. Appl. No. 18/923,518, Final Office Action dated Mar. 20, 2026.

U.S. Appl. No. 18/922,693, Final Office Action dated Dec. 22, 2025.

U.S. Appl. No. 19/441,480, Robert J. Short, Jr., RF-Based Material Detection Device That Uses Specific Antennas Designed for Specific Substances, filed Jan. 6, 2026.

* cited by examiner

| Frequency | Resonant Materials | App. A Priority Tier (Airport) | App. B Priority Tier (Border) | ... | App. N Priority Tier |
|---|---|---|---|---|---|
| 800 Hz | Ammonium Nitrate | 1 | 2 | ... | 2 |
| 2271 Hz | Nitroglycerin | 1 | 2 | ... | 2 |
| 2972 Hz | Nitrocelluose | 1 | 3 | ... | 2 |
| 709 Hz | Chlorine Gas | 1 | 2 | ... | 2 |
| 3034 Hz | Cocaine | 2 | 1 | ... | 3 |
| 3695 Hz | Heroin | 2 | 1 | ... | 3 |
| 1493 Hz | Methamphetamine | 2 | 1 | ... | 3 |
| 340 Hz | Hydrogen Peroxide | 1 | 2 | ... | 2 |
| 581 Hz | Acetone | 1 | 3 | ... | 2 |
| 83 KHz | Anthrax | 1 | 1 | ... | 1 |
| 65 KHz | Ricin | 1 | 1 | ... | 1 |
| - | - | - | - | ... | - |
| - | - | - | - | ... | - |
| - | - | - | - | ... | - |

RF-BASED SPECIAL MATERIAL DETECTION SYSTEM WITH SECURE MULTI-DIMENSIONAL AUTHENTICATION

CROSS-REFERENCE TO RELATED APPLICATIONS

This application is a continuation of U.S. application Ser. No. 18/936,500, filed Nov. 4, 2024, now U.S. Pat. No. 12,372,480, which claims the benefit of U.S. Provisional Application No. 63/668,633, filed Jul. 8, 2024, each of which is incorporated herein by reference.

FIELD OF THE DISCLOSURE

The present disclosure is generally related to RF-based material identification.

BACKGROUND

Current substance detection technologies at security checkpoints often lack the necessary sensitivity to identify trace amounts of advanced explosives and chemical agents. This insufficiency can result in dangerous materials passing undetected, thereby compromising the security of airports, government buildings, and other critical infrastructures.

The preservation of detection data for future evidentiary hearings is often flawed due to inadequate data integrity protocols and insufficient chain of custody procedures. These shortcomings can lead to the loss, tampering, or corruption of critical evidence, thereby undermining the reliability of the data in legal contexts.

Security personnel often require more context than is provided by sensors and detectors. Records of past incidents, criminal history, outstanding warrants, or other background information may allow security personnel and law enforcement officers to make more informed executive decisions.

SUMMARY

According to one aspect, a method includes accessing a material database associating each of a plurality of materials with one or more corresponding resonance frequencies. The method also includes, for each material of at least a subset of the plurality of materials in the material database: transmitting, via an RF transmitter, an RF signal into a target at a first resonance frequency for each material; receiving, via an RF receiver, a response signal from the target; and analyzing the response signal for resonance characteristics that indicate a presence of each material in the target. The method further includes generating a report of each material in the target indicated by the resonance characteristics. In addition, the method includes integrating the report with at least one of: a timestamp; image or video data from a camera; or geolocation data from a geolocation sensor.

In some embodiments, the method further includes encrypting the integrated report.

In some embodiments, the method further includes transmitting the encrypted integrated report to at least one of a security network or one or more third parties.

In some embodiments, integrating comprises integrating the report with data from one or more additional sensors including one or more of a motion sensor, a temperature sensor, a microphones, a thermal imager, a radar device, a lidar device, an ultrasound device, a speaker, or a wearable device.

In some embodiments, the report includes at least one of a signal strength of the response signal or a confidence level of identification.

In some embodiments, the material database indicates a priority of detecting each material of the at least the subset of materials for one or more applications, and wherein transmitting includes transmitting into the target the RF signal at the first resonance frequency for each material in order of the priority for a specific application.

In some embodiments, the at least the subset of the plurality of materials is selected by a user.

In some embodiments, the method further includes, if no materials are identified or ambiguous resonance characteristics are detected, repeating the transmitting, receiving, and analyzing using a second resonance frequency for one or more of the materials in the material database.

In some embodiments, the method further includes performing facial recognition on the image or video data and, if a person is positively identified by the facial recognition, storing personal details of the identified person in a security database.

In some embodiments, if the identified person is included in a list of individuals, the method further includes initiating an alarm or another automatic action.

According to another aspect, a system includes an interface configured to access a material database associating each of a plurality of materials with one or more corresponding resonance frequencies. The system also includes an RF transmitter configured to, for each material of at least a subset of the plurality of materials in the material database, transmit into a target an RF signal at a first resonance frequency for each material. The system further includes an RF receiver configured to receive a response signal from the target for each RF signal. In addition, the system includes a processor configured to analyze each response signal for resonance characteristics that indicate a presence of each material in the target; generate a report of each material in the target indicated by the resonance characteristics; and integrate the report with at least one of: a timestamp; image or video data from a camera; or geolocation data from a geolocation sensor.

In some embodiments, the processor is further configured to encrypt the integrated report.

In some embodiments, the processor is further configured to transmit the encrypted integrated report to at least one of a security network or one or more third parties.

In some embodiments, the processor is further configured to integrate the report with data from one or more additional sensors including one or more of a motion sensor, a temperature sensor, a microphones, a thermal imager, a radar device, a lidar device, an ultrasound device, a speaker, or a wearable device.

In some embodiments, the report includes at least one of a signal strength of the response signal or a confidence level of identification.

In some embodiments, the material database indicates a priority of detecting each material of the at least the subset of materials for one or more applications, and wherein the RF transmitter is configured to transmit into the target the RF signal at the first resonance frequency for each material in order of the priority for a specific application.

In some embodiments, the at least the subset of the plurality of materials is selected by a user.

In some embodiments, if no materials are identified or ambiguous resonance characteristics are detected, the processor is further configured to repeat the transmitting, receiving, and analyzing using a second resonance frequency for one or more of the materials in the material database.

In some embodiments, the processor is further configured to perform facial recognition on the image or video data and, if a person is positively identified by the facial recognition, store personal details of the identified person in a security database.

In some embodiments, if the identified person is included in a list of individuals, the processor is further configured to initiate an alarm or another automatic action.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Figure 1:
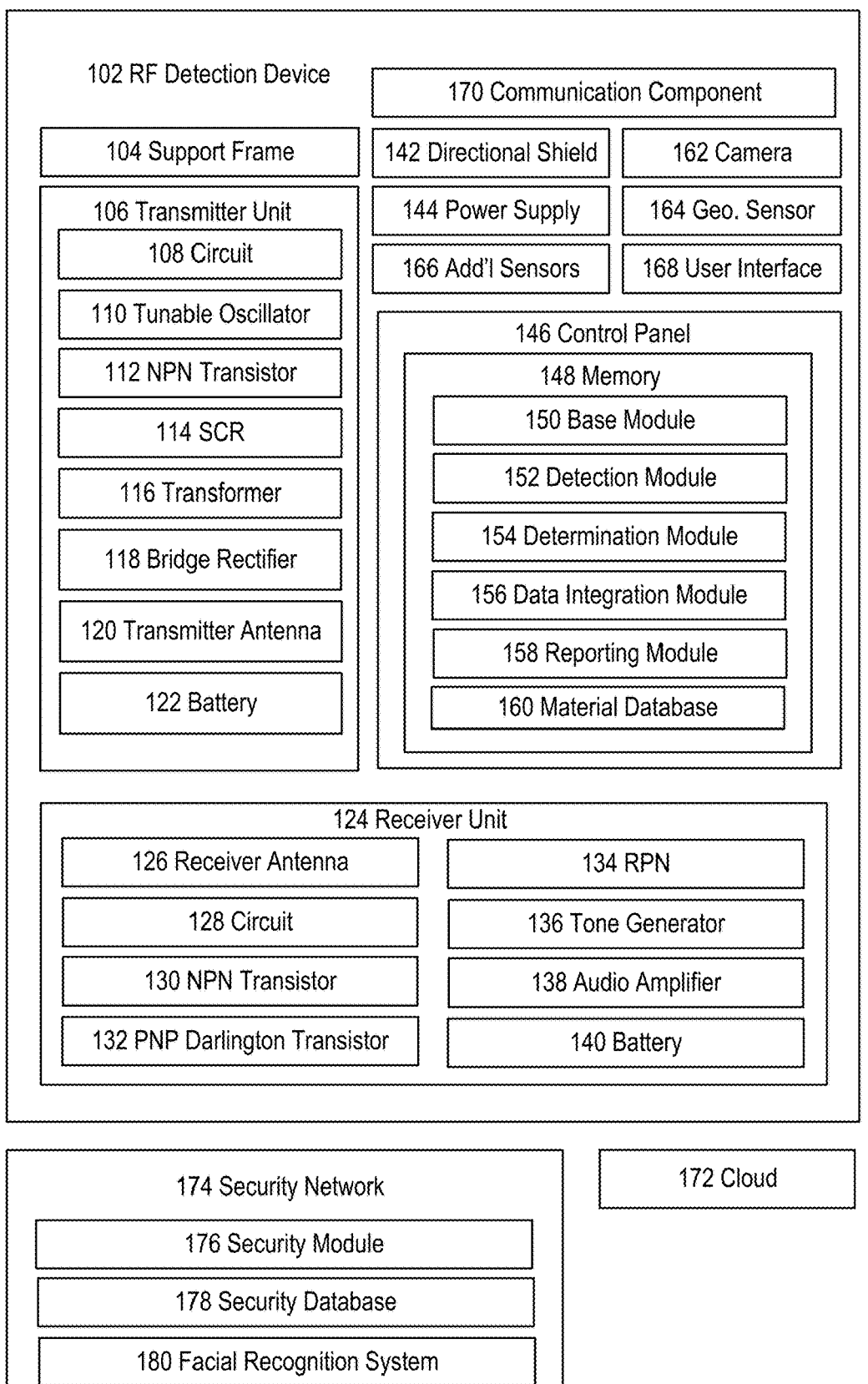
FIG. 1 is a schematic diagram of an RF detection device, according to an embodiment.

FIG. 1 illustrates an RF detection device 102, which may be a specialized system designed to detect and identify specific materials based on their unique resonance frequencies when exposed to electromagnetic signals. The RF detection device 102 incorporates an RF detection system similar to that disclosed in patent U.S. Ser. No. 11/493, 494B2, employing RF signals for the detection and identification of materials based on their resonance characteristics. The RF detection device 102 may operate by transmitting RF signals into the environment and analyzing the received signals for resonance characteristics that indicate the presence of a target material. The RF detection device 102 may be designed to detect a target material based on its resonance properties with specific RF frequencies. It utilizes the principle that materials resonate at particular frequencies when exposed to external RF signals, allowing for their identification and potential quantification. The RF detection device 102 may include a transmitter unit 106, a receiver unit 124, a control panel 146, a transmitter antenna 120, a receiver antenna 126, a directional shield 142, and a power supply 144. Upon activation, the control panel 146 initializes the system, powering up the transmitter unit 106, the receiver unit 124, and associated electronics. The control panel 146 may instruct the transmitter unit 106 to generate RF signals at specified frequencies, such as 180 Hz, 1800 Hz, etc., and amplitudes, such as 320V, 160V, etc., known to resonate with a target material. The transmitter unit 106 emits these RF signals through the transmit antenna 120 into the testing environment. The receiver unit 124 captures the RF signals using the receiver antenna 126. It then processes the received signals to identify resonance frequencies that indicate the presence of the target material.

Further, embodiments may include a support frame 104, which may be a structural component designed to provide stability and support to various subsystems and components of the RF detection device 102. The support frame 104 may provide proper alignment and positioning of the components, such as the transmitter unit 106, the receiver unit 124, antennas 120 126, and control panel 146. The support frame 104 may provide mounting points and secure attachment locations for subsystems such as the transmitter unit 106, the receiver unit 124, antennas 120 126, and control panel 146. By maintaining precise alignment and stability, the support frame 104 may minimize vibrations and unwanted movements that could interfere with the accuracy of RF signal transmission and reception. In some embodiments, the support frame 104 may be constructed from durable materials such as metal alloys or rigid polymers.

Further, embodiments may include a transmitter unit 106, which may include an electronic circuit 108, powered by a battery, such as a 12-volt, 1.2 amp battery, with a regulated output of nine volts. The circuit 108 may use a 555 timer as a tunable oscillator to generate a pulse rate. The output of the oscillator is fed in parallel to an NPN transistor 112 and a silicon-controlled rectifier (SCR) 114. The transistor may be used as a common emitter amplifier stage driving a transformer 116. The transformer 116 may be used to step up the voltage as needed. The balanced output of the transformer 116 feeds a bridge rectifier 118. The rectified direct current flows through a 100 K, three-watt resistor to terminal B of the transmitter antenna 120. A plurality of resistors and capacitors may fill in the circuit 108. In some embodiments, the transmitter antenna 120 may be formed from a coil of about 25 meters of 14-strand wire tightly wound around a one-centimeter PVC core. The transmitter antenna 120 may be, in one exemplary embodiment, in a 1"×3" configuration at the bottom end of the support frame 104. In some embodiments, the transmitter antenna 120 may be shielded approximately 315 degrees with the directional shield 142, formed from aluminum and copper, leaving a two-inch opening. Terminal A of the transmitter antenna 120 is switched to ground through the SCR 114. The SCR 114 is "fired" by the output of the 555 timer. This particular configuration generates a narrow pulsed waveform to the transmitter antenna 120 at a pulse rate as set by the 555 timer. Power is delivered through the 3 W resistor. Frequencies down to 4 Hz are achieved by an RC network containing a 100 K pot, a switch, and one of two capacitive paths. The circuit 108 may provide simple RC-controlled timing and deliver pulses to the primary of a step-up transformer 116, the output of which is full-wave rectified and fed to the transmitter antenna 120. The pulse rate is adjustable from the low Hz range to the low kHz range. The sharp pulses at low repetition frequencies yield a wide spectrum of closely spaced lines. The pulse rate is adjusted depending on the material to be detected. In some embodiments, one or more portions of the transmitter unit 106 may be implemented in an analog circuit configuration, a digital circuit configuration, or some combination thereof. In one example, the analog configuration may include one or more analog circuit components, such as, but not limited to, operational amplifiers, op-amps, resistors, inductors, and capacitors. In another example, the digital configuration may include one or more digital circuit components, such as, but not limited to, microprocessors, logic gates, and transistor-based switches. In some instances, a given logic gate may include one or more electronically controlled switches, such as transistors, and the output of a first logic gate may control one or more logic gates disposed "downstream" from the first logic gate.

Further, embodiments may include a circuit 108, which may be an assembly of electronic components that generate, modulate, and transmit radio frequency, RF signals. The circuit 108 may include oscillators, amplifiers, modulators, and other components that work together to produce a specific RF signal, which can then be transmitted through the transmitter antenna 120. The circuit 108 may include an oscillator, which generates a stable RF signal at a specified frequency. This frequency is selected based on the resonance characteristics of the target material. For example, the system may operate at 180 Hz or 1800 Hz, depending on the specific requirements of the detection task. Once generated, the RF signal is fed into an amplifier. The amplifier boosts the signal strength to a level suitable for transmission over the required distance. This ensures that the signal can propagate through various media and reach the receiver unit effectively. Modulation circuits are used to encode information into the RF signal. This may involve varying the amplitude, frequency, or phase of the signal to carry specific data related to the detection process. Modulation ensures that the transmitted signal can be uniquely identified and distinguished from other signals in the environment. The circuit 108 may include power control components that regulate the voltage and current supplied to the oscillator and amplifier. This ensures consistent signal output and helps in managing the power consumption of the device. In some embodiments, the transmitter may operate at voltages such as 160V and 320V, with adjustments made to optimize detection performance. The amplified and modulated RF signal is then routed to the transmitter antenna 120. The transmitter antenna 120 converts the electrical signal into an electromagnetic wave that can propagate through the air or other media. In some embodiments, the circuit 108 may be integrated with the device's control systems, allowing for automated adjustments based on pre-set parameters or operator inputs.

Further, embodiments may include a tunable oscillator 110, which may be a type of electronic component that generates a periodic waveform with a frequency that can be adjusted or tuned over a specific range. The tunable oscillator 110 within the transmitter unit 106 may be utilized to generate the RF signal that will be transmitted by the RF detection device 102. The tunable oscillator 110 in the transmitter unit 106 may be employed to produce an RF signal whose frequency can be precisely controlled. By adjusting the control inputs, the frequency of the output signal can be varied, allowing the system to adapt to different detection requirements and environmental conditions. This tuning mechanism may ensure that the oscillator produces a signal at the correct frequency needed for effective resonance with the target materials. By tuning the oscillator to specific frequencies, the system may detect various materials based on their unique resonant properties. The tunable oscillator 110 may work in conjunction with the control panel 146, which sends control signals to adjust the oscillator's frequency as needed. The tunable oscillator 110 may act as the core signal generation component in the transmitter unit 106. When the control panel 146 determines the required frequency for detection, it sends control signals to the tunable oscillator 110. The oscillator then adjusts its frequency, accordingly, generating an RF signal that matches the desired parameters. The tunable oscillator 110 may be connected to other components within the transmitter unit 106, such as the SCR 114 and the transformer 116. The SCR 114 manages the power supply to the oscillator, ensuring it receives the correct voltage. The transformer 116 steps up the voltage to the appropriate level required by the oscillator.

Further, embodiments may include an NPN transistor 112, which may be a type of bipolar junction transistor, BJT, that consists of three layers of semiconductor material: a layer of p-type material, the base layer, sandwiched between two layers of n-type material, the emitter and the collector. When a small current flows into the base, it allows a larger current to flow from the collector to the emitter, effectively acting as a current amplifier or switch in electronic circuits. The NPN transistor 112 in the transmitter unit 106 amplifies the RF signal generated by the oscillator. The NPN transistor 112 may operate in its active region, where a small input current applied to the base controls a larger current flowing from the collector to the emitter. This amplification process ensures that the RF signal reaches a sufficient power level for effective transmission. In some embodiments, the NPN transistor 112 may also function as a switch, controlling the flow of current within the circuit 108. When the base-emitter junction is forward-biased, a small voltage is applied, the NPN transistor 112 allows current to flow from the collector to the emitter. This switching action is used to modulate the RF signal, encoding information onto the carrier wave as required for the detection process. Proper biasing of the NPN transistor 112 is beneficial for stable operation. In some embodiments, resistors may be used to establish the correct biasing conditions to ensure that the NPN transistor 112 operates in its linear region for amplification or in saturation/ cutoff regions for switching. The biasing circuit ensures that the NPN transistor 112 responds predictably to input signals, maintaining signal integrity. In some embodiments, the NPN transistor 112 may be involved in modulating the RF signal. By varying the input current to the base, the amplitude, frequency, or phase of the RF signal can be modulated. This modulation is critical for encoding the detection data onto the transmitted signal, allowing for accurate chemical identification and analysis. In some embodiments, the NPN transistor 112 may be integrated into the broader transmitter circuit 108, working in conjunction with other components such as capacitors, inductors, and resistors. This integration ensures that the amplification and switching actions of the NPN transistor 112 are synchronized with the overall signal generation and transmission process. The circuit 108 design may leverage the NPN transistor's 112 properties to achieve the desired RF output characteristics.

Further, embodiments may include an SCR 114 or silicon controlled rectifier, which may be a type of semiconductor device that functions as a switch and rectifier, allowing current to flow only when a control voltage is applied to its gate terminal. The silicon controlled rectifier, SCR, 114, is utilized within the transmitter unit 106 to manage and control the power delivery to the RF signal generation components. The SCR 114 in the transmitter unit 106 may be employed to control the flow of power to the RF oscillator circuit. By applying a gate signal to the SCR 114, it switches from a non-conductive state to a conductive state, allowing current to pass through and power the oscillator. This control mechanism ensures that the oscillator only receives power when required, thereby conserving energy and preventing unnecessary power dissipation. The SCR 114 may act as a switching element in the transmitter unit 106. When the control panel 146 determines that the RF signal needs to be generated, a gate voltage is applied to the SCR 114. This triggers the SCR 114 to conduct, completing the circuit and enabling current to flow to the RF oscillator. The SCR 114 may ensure that sufficient current is supplied to the oscillator to produce a strong RF signal without being damaged by the high power levels. The gate terminal of the SCR 114 may be connected to the control panel 146, which manages the timing and application of the gate signal. This integration ensures that the SCR 114 is activated precisely when the RF signal needs to be transmitted, in sync with the overall operation of the detection system. The control panel 146 sends the appropriate signal to the SCR 114, ensuring accurate timing and efficient power usage. The SCR 114 may also serve as a protective component in the transmitter unit 106. By controlling the power flow, it prevents overloading and potential damage to the RF oscillator and other sensitive components. If the system detects any abnormal conditions, the control panel 146 can withhold the gate signal, keeping the SCR 114 in a non-conductive state and thereby cutting off power to protect the circuit.

Further, embodiments may include a transformer 116, which is an electrical device that transfers electrical energy between two or more circuits through electromagnetic induction. The transformer 116 is utilized within the transmitter unit 106 to manage and control the voltage levels required for the RF signal generation and transmission. The transformer 116 in the transmitter unit 106 may be employed to step up or down the voltage as needed to ensure the proper operation of the RF oscillator circuit. By adjusting the voltage levels, the transformer 116 ensures that the components within the transmitter unit 106 receive the appropriate voltage for efficient functioning. The transformer 116 may act as a voltage regulation element in the transmitter unit 106. When the control panel 146 determines that the RF signal needs to be generated, the transformer 116 adjusts the input voltage to the desired level. This adjustment involves converting the primary winding voltage to a higher or lower voltage in the secondary winding, depending on the requirements of the RF oscillator. The transformer ensures that the oscillator receives a stable and appropriate voltage, which is critical for producing a consistent and strong RF signal. The primary winding of the transformer 116 may be connected to the power supply 144, while the secondary winding is connected to the RF oscillator circuit. This integration ensures that the transformer 116 can effectively manage the voltage levels needed for RF signal generation. The control panel 146 monitors and regulates the input voltage to the transformer 116, ensuring accurate and efficient voltage conversion and delivery to the RF oscillator.

Further, embodiments may include a bridge rectifier 118, which is an electrical device designed to convert alternating current, AC, to direct current, DC, using a combination of four diodes arranged in a bridge configuration. The bridge rectifier 118 is utilized within the transmitter unit 106 to ensure that the RF signal generation components receive a steady and reliable DC power supply. The bridge rectifier 118 in the transmitter unit 106 may be employed to convert the incoming AC voltage from the power supply into a DC voltage. By using all portions of the AC waveform, the bridge rectifier 118 provides full-wave rectification, resulting in a more efficient conversion process and producing a smoother and more stable DC output. The bridge rectifier 118 may act as a power conversion element in the transmitter unit 106. When the control panel 146 determines that the RF signal needs to be generated, the AC voltage supplied to the transmitter unit is passed through the bridge rectifier 118. The rectifier converts the AC voltage into a DC voltage by directing the positive and negative halves of the AC waveform through the appropriate diodes. This process results in a continuous DC voltage output that is used to power the RF oscillator and other critical components. The input terminals of the bridge rectifier 118 may be connected to the AC power supply, while the output terminals provide the rectified DC voltage to the RF oscillator circuit. This integration ensures that the bridge rectifier 118 can effectively convert and deliver DC power for RF signal generation. The control panel 146 monitors the output of the bridge rectifier, ensuring that the DC voltage is stable and within the desired range for optimal performance.

Further, embodiments may include a transmitter antenna 120, which may be a device that radiates radio frequency, RF, signals generated by the transmitter unit 106 towards a target material. The transmitter antenna 120 may be designed to efficiently transmit the generated RF signals into the surrounding environment and ensure the signals reach the intended target with minimal loss. The transmitter antenna 120 may be responsible for the emission of RF signals necessary for detecting materials at a distance. In some embodiments, the transmitter antenna 120 may operate within a specific frequency range suitable for detecting the atomic structures and characteristics of the target materials. The frequency range may be determined by the system's requirements and the properties of the materials being detected. In some embodiments, the gain of the antenna may be a measure of its ability to direct the RF energy towards the target. Higher gain antennas focus the energy more effectively, resulting in stronger signal transmission over longer distances. The antenna gain may be optimized for the operational frequency range. In some embodiments, the radiation pattern of the transmitter antenna 120 describes the distribution of radiated energy in space. For effective material detection, the antenna may have a directional radiation pattern, concentrating the RF energy in a specific direction to enhance detection accuracy.

In some embodiments, impedance matching between the transmitter antenna 120 and the transmitter unit 106 may maximize power transfer and minimize signal reflection. Proper impedance matching may ensure efficient operation and reduce losses in the transmission path. In some embodiments, the physical design of the transmitter antenna 120 may include configurations such as dipole, patch, or horn antennas, depending on factors such as frequency range, gain, and environmental conditions. In some embodiments, the transmitter antenna 120 may be integrated with the transmitter unit 106 and other system components through connectors and mounting structures to ensure stable and reliable operation, with considerations for minimizing interference and signal loss.

Further, embodiments may include a battery 122, which may be a type of energy storage device that provides a stable and portable power source for the transmitter unit 106. The battery 122 within the transmitter unit 106 may be utilized to supply electrical energy to the various components involved in generating and transmitting the RF signal. The battery 122 may be designed to store electrical energy and supply it to the respective components as required. The battery 122 may be rechargeable or replaceable cells capable of providing DC voltage. They are selected based on factors such as voltage output and capacity, which may be measured in ampere-hours, Ah, and size to meet the power requirements of each component effectively. In the transmitter unit 106, battery 122 may serve as a portable power source, enabling the generation and transmission of RF signals without requiring a direct connection to an external power supply. The battery 122 powers components such as the oscillator circuit 108, SCR 114, and transformer 116, ensuring continuous operation in various environmental conditions. In some embodiments, the battery 122 used may include lithium-ion, nickel-metal hydride, or other types suitable for portable electronic devices.

Further, embodiments may include a receiver unit 124, which may include the electronic circuit 128. Voltage from the receiver antenna 126 passes through a 10 K gain pot to an NPN transistor 130 used as a common emitter. The output is capacitively coupled to a PNP Darlington transistor 132. A plurality of resistors and capacitors fills in the circuit 128. The output is fed through a RPN 134 to a 555 timer that is used as a voltage-controlled oscillator. A received signal of a given amplitude generates an audible tone at a given frequency. In some embodiments, the output is fed to a tone generator, such as a speaker, via a standard 386 audio amp. Sounds can be categorized as "grunts," "whines," and a particular form of whine with a higher harmonic notably present. In some embodiments, another indicator of a received signal is used, such as light, vibration, digital display, or analog display, in alternative to or in combination with the sound signal. A battery may be used to power the receiver circuit 128. The receiver circuit 128 may utilize a coherent, direct-conversion mixer, homodyne, with RF gain, yielding a baseband signal centered about DC. After a baseband gain stage, the baseband signal is fed to another timing circuit that functions as a voltage-controlled audio-frequency oscillator. The output of this oscillator is amplified and fed to a speaker. In some embodiments, one or more portions of the receiver unit 124 may be implemented in an analog circuit configuration, a digital circuit configuration, or some combination thereof. In one example, the analog configuration may include one or more analog circuit components, such as, but not limited to, operational amplifiers, op-amps, resistors, inductors, and capacitors. In another example, the digital configuration may include one or more digital circuit components, such as, but not limited to, microprocessors, logic gates, and transistor-based switches. In some instances, a given logic gate may include one or more electronically controlled switches, such as transistors, and the output of a first logic gate may control one or more logic gates disposed "downstream" from the first logic gate.

Further, embodiments may include a receiver antenna 126, which may be a device that captures the radio frequency, RF, signals responded from a target material. The receiver antenna 126 may be designed to efficiently receive the responded RF signals and transmit them to the receiver unit 124 for further processing and analysis. The receiver antenna 126 may be responsible for capturing the RF signals that have interacted with the target material. In some embodiments, the receiver antenna 126 may be designed to operate within the same frequency range as the transmitter antenna 120 to ensure compatibility and optimal performance for detecting the atomic structures and characteristics of the target materials. In some embodiments, the sensitivity may be a measurement of the receiver antenna's 130 ability to detect weak signals. A highly sensitive receiver antenna 126 may detect lowpower responded signals, enhancing the system's detection capabilities. In some embodiments, the noise figure of the receiver antenna 126 may indicate the level of noise it introduces into the received signal. A lower noise figure may be desirable as it ensures that the captured signals are as clean and strong as possible for accurate processing. In some embodiments, proper impedance matching between the receiver antenna 126 and the receiver unit 124 may maximize the power transfer from the antenna to the processing unit to ensure efficient and accurate signal reception. In some embodiments, the directional properties of the receiver antenna 126 may determine its ability to capture signals from specific directions to distinguish signals responded from the target material versus other sources of interference. In some embodiments, the gain of the receiver antenna 126 may enhance its ability to receive signals from distant targets. Higher gain antennas can improve the system's ability to detect materials at greater distances. In some embodiments, the physical design of the receiver antenna 126 may include various configurations such as dipole, patch, or parabolic antennas and may be based on factors such as frequency range, gain, and the specific detection requirements. In some embodiments, the receiver antenna 126 may be integrated with the receiver unit 124 and other system components through connectors and mounting structures to ensure stable and reliable operation, with considerations for minimizing interference and signal loss. In some embodiments, the receiver antenna 126 and the transmitter antenna 120 may be a single antenna used by the RF detection device 102.

Further, embodiments may include a circuit 128 within the receiver unit 124, which may be an assembly of electrical components designed to process the received RF signal. The circuit 128 may accurately interpret the RF signals responded or emitted from the target materials and convert them into data that can be analyzed by the RF detection device 102. The circuit 128 in the receiver unit 124 may be employed to handle signal amplification, filtering, demodulation, and signal processing. When an RF signal is received via the receiver antenna 126, it is typically weak and may contain noise or interference. The first stage of the circuit 128 may involve an amplifier that boosts the signal strength to a level suitable for further processing. This amplification ensures that even weak signals can be analyzed effectively. Next, the circuit 128 may include filtering components that serve to remove unwanted frequencies and noise from the received signal. Filters ensure that only the relevant frequency components of the RF signal are passed through, enhancing the signal-to-noise ratio and improving the clarity of the data. The circuit 128 may also incorporate a demodulator, which extracts the original information-bearing signal from the modulated RF carrier wave. This step interprets the data encoded in the RF signal, allowing the system to identify specific characteristics or signatures of the target materials. In some embodiments, the circuit 128 may include various signal processing components, such as analog-to-digital converters ADCs, which convert the analog RF signal into digital data. This digital data may then be processed by the control panel 146 or other computational units within the system for detailed analysis. The signal processing may involve algorithms to detect specific patterns, frequencies, or anomalies that indicate the presence of target materials. The components within the circuit 128 interact seamlessly to ensure accurate and efficient signal processing. For example, the amplified signal from the amplifier is passed to the filter, which cleans up the signal before it reaches the demodulator. The demodulated signal is then digitized by the ADC and sent to the control panel 146 for analysis.

Further, embodiments may include an NPN transistor 130, which may be a three-terminal semiconductor device used for amplification and switching of electrical signals. The NPN transistor 130 may consist of three layers of semiconductor material: a thin middle layer, or base, between two heavily doped layers, or emitter and collector. The NPN transistor operates by controlling the flow of current from the collector to the emitter, regulated by the voltage applied to the base terminal. The NPN transistor 130 integrated into the receiver unit 124 may be designed to process incoming RF signals and may operate in a configuration where the base-emitter junction is forward-biased by a small control voltage provided by the preceding stages of the circuit. The collector of the NPN transistor 130 may be connected to the circuit's supply voltage through a load resistor. When a small current flows into the base terminal, it allows a larger current to flow from the collector to the emitter. This amplification process increases the strength of the received signal, enabling subsequent stages of the circuit to process it more effectively. In the receiver unit 124, the NPN transistor 130 may be employed within amplifier stages where signal gain is beneficial. By controlling the base current, the circuit can modulate the transistor's conductivity and thereby regulate the amplification factor. This capability enhances weak RF signals received by the antenna and prepares them for further processing. In some embodiments, the NPN transistor 130 may be utilized in conjunction with capacitors and resistors to form amplifier circuits tailored to the specific requirements of the RF detection device 102. Capacitors may be used to couple AC signals while blocking DC components, ensuring that only the RF signal is amplified. Resistors set the biasing and operating points of the transistor, optimizing its performance within the circuit.

Further, embodiments may include a PNP Darlington transistor 132, which may be a semiconductor device consisting of two PNP transistors connected in a configuration that provides high current gain. The PNP Darlington transistor 132 integrates two stages of amplification in a single package, where the output of the first transistor acts as the input to the second, significantly boosting the overall gain of the circuit. The PNP Darlington transistor 132 amplifies weak RF signals received by the receiver antenna 126. The incoming RF signal is fed into the base of the first PNP transistor within the Darlington pair. The PNP Darlington transistor 132, due to its high current gain, allows a much larger current to flow from its collector to the emitter compared to the base current. The output from the collector of the first transistor serves as the input to the base of the second PNP transistor in the Darlington pair. The second PNP transistor further amplifies the signal received from the first stage, again with significant current gain.

Further, embodiments may include an RPN 134 or resistor potentiometer network, which may be an electrical circuit composed of resistors and potentiometers interconnected in a specific configuration to achieve desired electrical characteristics, such as voltage division, signal attenuation, or adjustment of resistance values. Potentiometers, also known as variable resistors, allow for manual adjustment of resistance within the circuit, while resistors set fixed values to control current flow and voltage levels. The RPN 134 in the receiver unit 124 may be configured to adjust signal levels received from the antenna and prepare them for further processing. This network consists of resistors and potentiometers connected to achieve precise voltage division and attenuation. By adjusting the potentiometers, operators can fine-tune the signal strength and impedance matching, optimizing signal quality for subsequent stages of signal processing. The RPN 134 ensures that incoming RF signals from the receiver antenna 126 are properly attenuated and scaled to match the input requirements of downstream electronics. This calibration process maintains signal integrity and fidelity throughout the reception and decoding process. In some embodiments, the potentiometers within the RPN 134 may allow for manual adjustment of signal parameters such as amplitude and impedance, enabling operators to optimize signal reception based on environmental conditions and operational requirements.

Further, embodiments may include a tone generator 136, which may be a type of electronic device that produces audio signals or tones to alert the user of specific conditions. The tone generator 136 within the receiver unit 124 is utilized to generate audible alerts when the detection system identifies the presence of target materials. The tone generator 136 in the receiver unit 124 may be employed to create specific tones that serve as audible indicators for the user. By generating these tones, the tone generator 136 provides immediate feedback to the operator, signaling the detection of target materials in real time. The tone generator 136 may ensure that the operator is promptly informed of detections without needing to constantly monitor visual displays. The tone generator 136 produces distinct sounds that correspond to different detection events, making it easier for the operator to understand the system's status and respond accordingly. The tone generator 136 may act as a critical alerting component within the receiver unit 124. When the control panel 146 determines that the RF signal corresponds to a detected target material, it sends a signal to the tone generator 136. This triggers the tone generator 136 to produce a sound, alerting the operator to the detection event.

Further, embodiments may include an audio amplifier 138, which may be a type of electronic device designed to increase the amplitude of audio signals. The audio amplifier 138 within the receiver unit 124 may be utilized to boost the audio signals generated by the tone generator 136, ensuring that the output sound is sufficiently loud and clear for the operator to hear. The audio amplifier 138 in the receiver unit 124 may be employed to enhance the volume and clarity of the audio tones produced by the tone generator 136. By amplifying these audio signals, the audio amplifier 138 ensures that the operator receives audible alerts even in noisy environments, thus improving the overall effectiveness of the detection system. The audio amplifier 138 may act as an intermediary component between the tone generator 136 and the output device, such as a speaker. When the tone generator 136 produces an audio signal, this signal is sent to the audio amplifier 138. The amplifier then boosts the signal's power, making it strong enough to drive the speaker and produce an audible sound. The audio amplifier 138 is connected to other components within the receiver unit 124, including the tone generator 136 and the speaker. It receives the low-power audio signals from the tone generator 136 and amplifies them to a level suitable for driving the speaker.

Further, embodiments may include a battery 140, which may be a type of energy storage device that provides a stable and portable power source for the receiver unit 124. The battery 140 within the receiver unit 124 may be utilized to supply electrical energy to the various components involved in generating and transmitting the RF signal. The battery 140 may be designed to store electrical energy and supply it to the respective components as required. The battery 140 may be rechargeable or replaceable cells capable of providing DC voltage. They are selected based on factors such as voltage output and capacity, which may be measured in ampere-hours, Ah, and size to meet the power requirements of each component effectively. In the receiver unit 124, batteries provide electrical energy to receive and process RF signals detected by the antenna. The battery 140 may power components such as amplifiers, filters, and signal processing circuitry, enabling the device to analyze incoming RF signals and extract relevant information. In some embodiments, the battery 140 used may include lithium-ion, nickel-metal hydride, or other types suitable for portable electronic devices.

Further, embodiments may include a directional shield 142, which may be a physical barrier or enclosure designed to direct or block electromagnetic radiation in a specific direction. The directional shield 142 may be constructed from conductive materials such as metal to attenuate or reflect RF signals, thereby controlling the propagation of electromagnetic waves. The directional shield 142 may be positioned around the RF oscillator and antenna components and may act as a physical barrier that prevents RF signals from propagating in undesired directions, thereby enhancing the precision and accuracy of signal transmission and reception. During operation, when the transmitter unit 106 generates an RF signal, the directional shield 142 helps to focus and channel this signal towards the intended detection area. By reducing signal dispersion and reflection, the directional shield 142 improves the efficiency of signal transmission and enhances the system's overall sensitivity to detecting RF responses from underground objects or materials.

Further, embodiments may include a power supply 144, such as batteries serving as the power source for specific components within the RF detection device 102, including the control panel 146. These batteries are designed to store electrical energy and supply it to the respective components as required. The batteries in the control panel 146 may be rechargeable or replaceable cells capable of providing DC voltage. They are selected based on factors such as voltage output and capacity, which may be measured in ampere-hours, Ah, and size to meet the power requirements of each component effectively. In some embodiments, the control panel 146 relies on batteries to maintain functionality for user interface operations, data processing, and communication with other parts of the RF detection device 102. The batteries in the control panel 146 ensure that they remain operational during field use, supporting tasks such as signal monitoring, parameter adjustment, and data transmission. In some embodiments, the batteries used in these components may include lithium-ion, nickel-metal hydride, or other types suitable for portable electronic devices. They are integrated into the design to provide sufficient power capacity and longevity, allowing the RF detection device 102 to operate autonomously for extended periods between recharges or battery replacements.

Further, embodiments may include a control panel 146, which may be a centralized interface comprising electronic controls and displays. The control panel 146 may serve as the user-accessible interface for configuring, monitoring, and managing the RF detection device's 102 operational parameters and data output. In some embodiments, the control panel 146 may be designed to provide operators with intuitive access to control and monitor various aspects of the RF detection device 102. The control panel 146 may allow for the configuration of settings such as signal frequency, transmission power, receiver sensitivity, and signal processing algorithms. In some embodiments, operators may use the control panel 146 to initiate and terminate detection operations, adjust calibration settings, and troubleshoot operational issues. In some embodiments, the control panel 146 may include a graphical display screen or LED indicators to present real-time status information and measurement results. In some embodiments, input controls such as buttons, knobs, or touch-sensitive panels may enable operators to interact with the device, input commands, and navigate through menu options. The control panel 146 may interface directly with the internal electronics of the RF detection device 102, including the transmitter unit 106, receiver unit 124, antennas and signal processing circuitry. Through electronic connections and communication protocols, the control panel 146 may send commands to adjust operational parameters and receive feedback and status updates from the device. In some embodiments, the control panel 146 may be mounted on the support frame 104 and may provide an operator with control of the RF detection device 102, including adjusting various settings and signaling the operator of a detected material. In some embodiments, a rechargeable battery may power the RF detection device 102, including the transmitter unit 106, the receiver unit 124, and the control panel 146. In some embodiments, multiple batteries may be used. In some embodiments, a tone generator, such as a speaker, may be mounted to the support frame 104 to provide audible signals to the operator for detecting target materials.

Further, embodiments may include a memory 148, which may include suitable logic, circuitry, and/or interfaces that may be configured to store a machine code and/or a computer program with at least one code section executable by a processor. Examples of implementation of the memory 148 may include, but are not limited to, Random Access Memory (RAM), Read Only Memory (ROM), Hard Disk Drive (HDD), and/or a Secure Digital (SD) card.

Further, embodiments may include a base module 150, which may sweep through a list of frequencies in order to find which frequencies generate a response in a sample material. For each frequency, the base module 150 may initiate the detection module 152 to determine if the frequency elicits a response from the material based on its resonant characteristics. The base module 150 may then generate a table of which frequencies elicited a response in the sample material. The base module 150 may then initiate the determination module 154 to compare the table to the material database 160 in order to identify which material or materials are present in the sample. The base module 150 may initiate the data integration module 156 to integrate the data from the detection module 152 and determination module 154 with data from the camera 162, geolocation sensor 164, and additional sensors 166. The base module 150 may then initiate the reporting module 158 to send this integrated data to the security network 174. The base module 150 may receive a response from the security network 174 with additional data. All data is then displayed via the user interface 168.

Further, embodiments may include a detection module 152, which may be responsible for configuring and generating the RF signal through the transmitter unit 106. The detection module 152 may interact with the control panel 146 to set parameters such as frequency and amplitude. Once the RF signal is generated and transmitted via the transmitter antenna 120, the detection module 152 may monitor the receiver unit 124 for RF signal reception. Upon receiving the RF signal via the receiver antenna 126, the detection module 152 processes the signal to extract relevant data about the presence of target materials. This processed data is then sent to the base module 150 for further analysis and decision-making. The detection module 152 operates iteratively as long as the system remains activated, continuously polling and analyzing data to detect and identify target materials based on the received RF signals.

Further, embodiments may include a determination module 154, which may identify the material or materials present in a sample. The determination module 154 may receive a table of frequencies and responses from the base module 150, which correspond to the frequencies at which resonance with a material was detected. The determination module 154 may then compare that table to the material database 160 to identify materials present in the sample.

Further, embodiments may include a data integration module 156, which may integrate the data from the detection module 152, determination module 154, and the various sensors such as the camera 162, geolocation sensor 164, and additional sensors 164. This data may be formatted, time-stamped, and encrypted.

Further, embodiments may include a reporting module 158, which may report the integrated data to the security network 174 via the cloud 172. The reporting module 158 may also send the integrated data to one or more third parties so that multiple records exist of the integrated data. This prevents the integrated data from being manipulated by one person or entity and increases the likelihood of the integrated data being used as convincing evidence in a legal proceeding.

Further, embodiments may include a material database 160, which may contain a list of materials and their associated resonance frequencies. These resonance frequencies are the frequencies of electromagnetic waves emitted from the transmitter antenna 120 that produce a response from the material that can be received by the receiver unit 124.

Further, embodiments may include a camera 162 for capturing images and videos. The camera 162 may include various types, such as digital cameras, infrared cameras, thermal cameras, or multi-spectral cameras. The camera 162 may have capabilities for high-resolution imaging, zoom functionality, autofocus, image stabilization, and low-light performance. Additionally, the camera 162 may be integrated with advanced features such as object recognition, facial recognition, motion detection, and video analytics. The captured images and videos can be processed in real-time or stored for later analysis. The camera 162 may also be utilized for purposes such as security monitoring, environmental sensing, user authentication, and interaction enhancement in various applications.

Further, embodiments may include a geolocation sensor 164, which may determine the geographical location of the device. The geolocation sensor 164 may use various techniques such as Global Positioning System (GPS), Assisted GPS (A-GPS), Wi-Fi-based positioning, cell tower triangulation, and other location-based services. The geolocation sensor 164 may provide real-time location tracking, geofencing, and location-based triggers for specific actions or alerts.

Further, embodiments may include a plurality of additional sensors 166 that may be used, such as motion sensors, temperature sensors, humidity sensors, microphones, a thermal imager, a radar device, a lidar device, an ultrasound device, a speaker, wearable devices, etc. Further, embodiments may include a user interface 168, which may either accept inputs from users or provide outputs to the users or may perform both the actions. In one case, a user can interact with the user interface 168 using one or more user-interactive objects and devices. The user-interactive objects and devices may include user input buttons, switches, knobs, levers, keys, trackballs, touchpads, cameras, microphones, motion sensors, heat sensors, inertial sensors, touch sensors, or a combination of the above.

Further, the user interface 168 may either be implemented as a Command Line Interface (CLI), a Graphical User Interface (GUI), a voice interface, or a web-based user-interface. The user interface 168 may display data on detected materials.

Further, embodiments may include a communication component 170 for data transmission and reception. The communication component 170 may support various communication protocols and interfaces, such as Wi-Fi, Bluetooth, Zigbee, Near Field Communication (NFC), and cellular networks (e.g., 4G, 5G). This component can enable the device to communicate with other devices, systems, and networks. It may support high-speed data transfer, secure communication channels, and low-power communication modes for energy efficiency. The communication component 170 may facilitate remote monitoring, control, and data exchange with cloud services, ensuring seamless integration with other systems and devices. Additionally, it may include features for data encryption, error detection and correction, and signal amplification to enhance communication reliability and security.

Further, embodiments may include a cloud 172 or communication network, which may be a wired and/or wireless network. The communication network, if wireless, may be implemented using communication techniques such as Visible Light Communication (VLC), Worldwide Interoperability for Microwave Access (WiMAX), Long Term Evolution (LTE), Wireless Local Area Network (WLAN), Infrared (IR) communication, Public Switched Telephone Network (PSTN), Radio waves, and other communication techniques known in the art. The communication network may allow ubiquitous access to shared pools of configurable system resources and higher-level services that can be rapidly provisioned with minimal management effort, often over the Internet, and relies on the sharing of resources to achieve coherence and economies of scale, like a public utility, while third-party clouds enable organizations to focus on their core businesses instead of expending resources on computer infrastructure and maintenance.

Further, embodiments may include a security network 174, which may be a computer or network of computers that manage the security of a location, business, checkpoint, government building, or other entity requiring security features. The security network 174 may include high-definition surveillance camera feeds with capabilities such as pan-tilt-zoom, night vision, motion detection, and facial recognition, providing real-time video monitoring. The security network 174 may include access control systems comprising electronic locks, biometric scanners, RFID card readers, and keypad entry systems, maintaining logs to track authorized entry and exit. The security network 174 may include intrusion detection systems with sensors like infrared, microwave, ultrasonic, and pressure sensors, connected to alarms and notification systems for instant alerts. The security network 174 may include secure communication systems, incorporating encrypted radios, intercoms, and emergency communication devices to ensure seamless coordination among security personnel. The security network 174 may include environmental sensors for smoke, fire, gas leaks, and other hazards, providing early warning and automatic alerts to enhance safety protocols. The security network 174 may include automated monitoring and alert systems, utilizing artificial intelligence and machine learning to analyze data, detect anomalies, and generate automated alerts. The security network 174 may include high-capacity data storage solutions to archive video footage, access logs, and other security data, with encryption and backup solutions for data integrity and availability. The security network 174 may include digital sector maps and geofencing capabilities, aiding in monitoring specific zones, setting virtual boundaries, and tracking movement within defined perimeters. The security network 174 may include tools for incident response and reporting, allowing security personnel to log incidents, track response actions, and generate comprehensive reports for analysis and compliance. The security network 174 may include integration capabilities with other management systems, such as building management systems, fire alarm systems, and emergency response systems, facilitating coordinated responses. The security network 174 may include remote access and control features, enabling authorized personnel to monitor and manage the security infrastructure via secure mobile applications or web portals. The security network 174 may include user and role management capabilities, assigning different access levels and permissions based on roles and responsibilities to ensure appropriate security controls. The security network 174 may include redundancy and failover mechanisms, with backup power supplies, redundant communication paths, and failover servers to maintain system functionality during power outages or hardware failures.

Further, embodiments may include a security module 176, which may receive data from the reporting module 158 of the RF detection device 102. The security module 176 may then determine if the data requires any response from the security network 174, such as setting off alarms, locking doors, or shutting down systems. The security module 176 may use the facial recognition system 180 to identify a person or persons of interest from the camera 162 data. Then, the security module 176 may determine if there is any relevant data in the security database 178 that the operator of the RF detection device 102 should have. For example, if the identified person has any outstanding warrants or any prior incidents. This data is sent to the base module 150 of the RF detection device 102 to be displayed via the user interface 168 alongside the other collected data.

Further, embodiments may include a security database 178, which contains data on security features, automated responses, persons of interest, security staff, and any other data used by the security network 174. The security database 178 may also store any reported data from the RF detection device 102.

Further, embodiments may include a facial recognition system 180, which can identify and verify individuals based on their facial features. The facial recognition system 180 may use algorithms and machine learning techniques to analyze facial patterns and match them against a database of known faces. This system can be used for various applications such as security access control, user authentication, surveillance, and personalized user experiences. It may also integrate with other systems to enhance security and provide additional functionalities based on facial recognition data.

In another embodiment, a material detection system uses a hybrid antenna that can operate both in RF-based and magnetic-based detection modes. This system is capable of switching between detecting materials based on their interaction with the RF field or the magnetic field, depending on the material being analyzed. In RF mode, the antenna transmits RF waves, and the system analyzes how the material reflects or absorbs these waves, providing information based on the dielectric constant or conductive properties of the material. In magnetic mode, the antenna focuses on the interaction between the material and the magnetic field component of the electromagnetic wave, allowing detection of materials with high magnetic permeability or strong magnetic responses. For example, the system could be used to detect metallic substances or magnetic compounds, such as those found in explosive materials, by optimizing the detection process based on which field interaction yields the clearest signature.

In yet another embodiment, a near-field material detection system uses a magnetic-based loop antenna that focuses on magnetic field interaction within close proximity to the target material. This system uses magnetic resonance principles, detecting changes in the magnetic field due to interactions with materials possessing magnetic susceptibility, such as ferromagnetic metals. The loop antenna generates a localized oscillating magnetic field, and when materials are introduced into the detection zone, they alter the field by inducing eddy currents or magnetic resonance effects. These changes are then measured to determine the material's properties. This method is particularly useful in applications such as industrial quality control or close-range security screening, where detecting the magnetic characteristics of a material offers clear advantages.

In still another embodiment, far-field magnetic resonance techniques are employed for material detection at greater distances. This system operates by transmitting an electromagnetic wave where the magnetic field component is emphasized, focusing on its interaction with materials that have resonant magnetic properties. By tuning the system to specific resonant frequencies, materials that exhibit strong magnetic responses, such as certain alloys or ferromagnetic materials, can be detected over a larger range. The detection system then analyzes the phase or amplitude of the reflected wave to infer material characteristics. This embodiment is particularly suitable for remote sensing applications, such as geological surveys, where materials can be identified based on their magnetic resonance even when located at a distance from the detection apparatus.

In other embodiments, an array of antennas is used to simultaneously detect materials based on both RF and magnetic field interactions. The antenna array consists of dipole antennas optimized for detecting the electric component of the RF wave and loop antennas that focus on the magnetic field interaction. These two types of signals are combined to create a composite material signature, allowing for detailed analysis of both the dielectric and magnetic properties of the material. By processing both electric and magnetic field data, the system can more accurately identify materials that exhibit a combination of electrical conductivity and magnetic permeability, such as advanced composites or stealth materials. This dual-mode system can be particularly useful in defense or aerospace applications.

In still other embodiments, a magnetic-based antenna system is designed for material detection in environments where RF signals would typically be degraded, such as underground or underwater. This system uses a loop antenna to generate a magnetic field that interacts with materials possessing strong magnetic properties, even in situations where RF signals are heavily attenuated. The antenna detects variations in the magnetic field caused by materials with high permeability, such as iron or nickel-based substances. This method allows for the detection of magnetic materials in conditions where RF detection would be unreliable, such as in deep-sea exploration or subterranean mining operations, where conventional RF signals would fail to penetrate effectively.

In further embodiments, a phased array system is designed specifically to manipulate the magnetic component of the electromagnetic wave for high-resolution material detection. A phased array of loop antennas is used to steer and focus the magnetic field, creating a directed magnetic beam that can scan across a target area. The system detects materials based on how they alter the magnetic field, allowing for precise location and identification of magnetic objects. By adjusting the phase and amplitude of each antenna element, the system provides a fine degree of control, enabling highly localized material detection. This approach is useful in situations requiring detailed spatial resolution, such as identifying hidden metallic objects in security screening or detailed inspections in industrial settings.

In additional embodiments, a portable or wearable material detection system is implemented using a small, magnetic-based loop antenna for detecting magnetic materials in close proximity. This compact system allows security personnel or industrial workers to move through different environments while continuously monitoring for materials that exhibit magnetic properties. The loop antenna generates a localized magnetic field and detects perturbations caused by nearby magnetic materials, such as concealed weapons or magnetic tags. The system then alerts the user when such materials are detected, making it ideal for field operations where mobility and ease of use are critical.

In yet another embodiment, the material detection system is entirely RF-based, using a highly optimized RF antenna to detect materials based solely on their interaction with the RF field. The RF antenna transmits electromagnetic waves at specific frequencies, and the system analyzes how these waves are reflected, absorbed, or scattered by the material. By focusing on the dielectric constant or conductive properties of the target material, the system can accurately identify substances such as explosives, chemicals, or other dielectric materials. This approach is particularly effective in environments where magnetic field-based detection is unnecessary or less effective. The RF-based system can be adapted for wide-ranging applications, from industrial material testing to security scanning, where detecting the electrical characteristics of the material is sufficient for identification.

Figure 2:
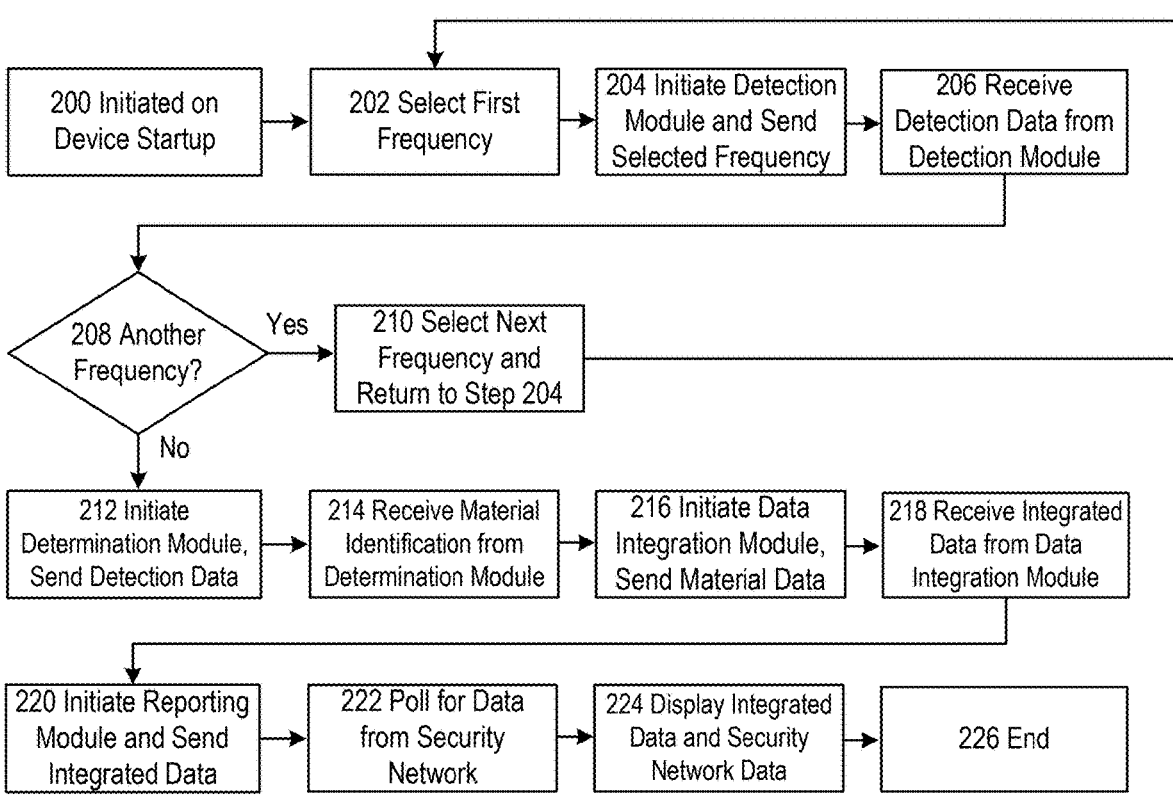
FIG. 2 is a flow chart of a method performed by a Base Module, according to an embodiment.

FIG. 2 displays the base module 150. The base module 150 may be initiated at step 200 when the RF detection device 102 starts up. The base module 150 may also be initiated when a sample is detected or when a user presses a button to begin sample identification. The base module 150 may select at step 202 a first frequency to transmit. This may be selected from a range of frequencies such as 10 Hz-1000 KHz. The range of frequencies may correspond to the range in which the resonant frequencies of the most common materials are found. The frequencies may be selected in any order, but optimally, the frequencies most likely to resonate with materials of interest may be selected first. For example, if Ammonium Nitrate is a material of interest, then its resonant frequency, which may be 800 Hz, may be selected first. The base module 150 may refer to the material database 160 in order to determine which order to select the frequencies in. Each entry in the material database 160 may have a priority tier associated with a frequency and with an application of the RF detection device 102. For example, an airport security application may prioritize explosives, such as Ammonium Nitrate and Nitroglycerin. Cocaine is illegal but unlikely to cause mass harm on a crowded airplane, so it is a lower priority. For another example, a border crossing station may prioritize commonly smuggled drugs, such as Cocaine and Heroin. Acetone, while it can be used to create explosives, is not a high priority as it has many legal uses, and border checkpoints are not high-density population centers like airports. The base module 150 may initiate at step 204, and the detection module 152. The base module 150 may then send the selected frequency to the detection module 152. The detection module 152 may generate an RF signal at the selected frequency through the transmitter unit 106. The detection module 152 may interact with the control panel 146 to set parameters such as frequency and amplitude. Once the RF signal is generated and transmitted via the transmitter antenna 120, the detection module 152 may monitor the receiver unit 124 for RF signal reception. Upon receiving the RF signal via the receiver antenna 126, the detection module 152 processes the signal to extract relevant data about the presence of target materials. This processed data is then sent to the base module 150 for further analysis and decision-making. The base module 150 may receive at step 206 detection data from the detection module 152. Detection data may be a simple binary indication if the transmission frequency produced a resonance response from the sample. For example, the data may indicate there was a resonance response at 180 Hz but no resonance response at 181 Hz. In some embodiments, detection data may include the detected response signal. Detection data may also include the strength of the response signal, such as −1.5 dB. If the data from the detection module 152 is complex, then the base module 150 may also undertake data processing steps such as cleaning, formatting, reduction, and analysis. The base module 150 may determine at step 208 if another frequency has not yet been selected. In some embodiments, certain frequencies may be selected multiple times to improve the confidence level of the detection data for those frequencies. The base module 150 may include a smart frequency selection algorithm, which may select the next frequency based on an optimized selection pattern. For example, if a material was detected at a certain frequency, the selection algorithm may cause the base module 150 to select the next frequency where that same material would be detected to quickly confirm the presence of the material. Likewise, if a material was not detected at its expected frequency, other resonant frequencies for that material may not be selected at all. If another frequency has not yet been selected, the base module 150 may select at step 210, the next frequency, and return to step 204. If each frequency in the frequency range has been selected, the base module 150 may initiate at step 212 the determination module 154 and send in the detection data for each selected frequency. This may be a list of which selected frequencies produced any response at all or a data table of selected frequencies and their associated received resonance response or lack thereof. The determination module 154 may compare the received detection data to the material database 160 to identify materials present in the sample. The base module 150 may receive at step 214 material identification or identifications from the determination module 154. For example, the determination module 154 may identify Nitrocellulose with a 95% confidence interval. The base module 150 may initiate at step 216 the data integration module 156 and send the material data. Material data may include the identity of each material, the signal strength of the response, and the confidence interval that the identification is correct. If the confidence interval is not 100%, then the possible alternate materials may also be included in the material data. The data integration module 156 may integrate material data and data from the various sensors such as the camera 162, geolocation sensor 164, and additional sensors 164. This data may be formatted, timestamped, and encrypted. The base module 150 may receive at step 218 integrated data from the data integration module 156. Integrated data may include the identification of any identified materials, a confidence interval of the identification, the signal strength of the response signal, video data from the camera before, after, and during the detection, the geolocation of the RF detection device 102 at the time of the detection, data from any additional sensors 166 at the time of the detection, and a timestamp of when the data was integrated. The base module 150 may initiate at step 220, the reporting module 158, and send in the integrated data. The reporting module 158 may report the integrated data to the security network 174 via the cloud 172. The reporting module 158 may also send the integrated data to one or more third parties so that multiple records exist of the integrated data. The base module 150 may poll at step 222 for a response from the security network 174. This response may include additional data or instructions for the user of the RF detection device 102. For example, the security network 174 may identify a person with data from the camera 162. This person may have been caught with illegal materials in the past or may have a criminal record. For example, the identified person may have an outstanding warrant for unlawful possession of a firearm. This data on the person may be sent to the base module 150 so that it can be displayed to the user of the RF detection device 102 via the user interface 168. The base module 150 may display at step 224 the integrated data and any data from the security network 174 via the user interface 168. For example, a user of the RF detection device 102 may be able to view the material data on a material as soon as it is detected. The user may then interact with the user interface 168 to view data such as confidence interval and signal strength. The user may be able to playback video from the camera at around the time the material was detected. The user may be able to view warnings, instructions, personal records, material hazard data, or any other data sent from the security network 174. The base module 150 may end at step 226.

Figure 3:
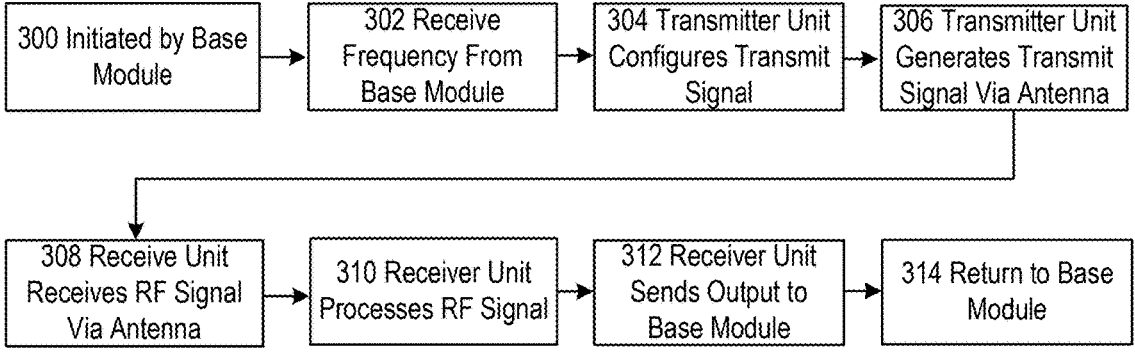
FIG. 3 is a flow chart of a method performed by a Detection Module, according to an embodiment.

FIG. 3 displays the detection module 152. The detection module 152 may be initiated at step 300 by the base module 150. In some embodiments, the detection module 152 may be initiated by the user or operator through the control panel 146. The detection module 152 receives at step 302 the selected frequency from the base module 150 154. The detection module 152 may command at step 304 the transmitter unit 106 to configure the transmit signal. The transmitter unit 106 prepares the signal that will be transmitted at the selected frequency. In some embodiments, the parameters and components may be set up with the desired characteristics to generate the RF signal. The control panel 146 determines the specific parameters of the RF signal that need to be generated. Once the parameters are set, the control panel 146 sends a command to activate the oscillator circuit within the transmitter unit 106. The oscillator circuit may be responsible for generating a stable RF signal at the desired frequency and may consist of components like capacitors, inductors, and amplifiers that work together to create the oscillating signal. The power delivery to the oscillator circuit may be managed by the SCR 114. When the control panel 146 sends a gate signal to the SCR 114, it switches from a non-conductive to a conductive state, allowing current from the power source, such as batteries, to flow to the oscillator circuit. After the oscillator circuit generates the RF signal, the transformer 116 adjusts the voltage level of the signal to match the requirements of the transmit antenna 120. It may also provide impedance matching to ensure efficient signal transmission. The transformer 116 ensures that the RF signal is at the appropriate voltage and current levels for optimal transmission. For example, the control panel 146 may determine that an RF signal with a frequency of 50 Hz requires a specific power level. It sends a command to the transmitter unit 106 to configure this signal. The oscillator circuit is activated, generating an RF signal at 50 Hz. The SCR 114 is triggered, allowing power from the batteries to flow to the oscillator circuit. The generated signal is then conditioned by the transformer 116, ensuring it is at the correct voltage level for transmission. The detection module 152 may command at step 306 the transmitter unit 106 to generate the transmit signal via the transmit antenna 120. The transmitter unit 106 generates the RF signal and transmits it through the transmit antenna 120 by converting electrical energy into radio waves that can be used for detecting specific materials. The transmit antenna 120 radiates the RF signal into the environment. The radio waves propagate through the medium, such as air or ground, and interact with the target materials. The interaction between the RF signal and the target materials will produce detectable changes in the signal, which can be received and analyzed by the receiver unit 124. For example, the transmitter unit 106 generates a wave pulse at a specified frequency that is transmitted directionally into the ground. The generated frequency is closely approximate or exact to that of the target material, and that relationship creates a responsive RF wave and/or a magnetic line between the transmitter antenna 120 and the target. When the RF detection device 102 is aligned with a target material, for example, when the opening of the directional shield 142 is pointing toward the target material, the voltage produced by the receiver antenna 126 changes and thereby produces a detection output signal, such as an audio signal having a tone different than that of the baseline. A response wave is produced by the target material that amplifies, resonates, offsets, or otherwise modifies the magnetic field passing through the receiver antenna 126 to alter the voltage produced, thereby generating the output signal. The receiver antenna 126 is responding to a voltage increase from the transmitter antenna 120 swinging over the magnetic line to the material. The detection module 152 may record the time the signal was transmitted. The detection module 152 may command at step 308 the receiver unit 124 to receive RF signal via receiver antenna 126. The receiver unit 124 captures the RF signal that has interacted with the environment and potential target materials using the receiver antenna 126. The receiver antenna 126 captures the incoming RF signal, which has been transmitted by the transmitter unit 106 and has interacted with the environment and any target materials present. The receiver antenna 126 may be designed to effectively capture these radio waves and convert them back into electrical signals. Once the RF signal is received by the receiver antenna 126, it may be fed into an RF amplifier, which boosts the signal strength without significantly altering its characteristics. In some embodiments, the use of the standard atomic structure of a material may be used to calculate the resonant frequency to which a particular material would generate or respond. Each element and material include a definable atomic structure composed of the total number of protons and neutrons of that target material. This unique nuclear composition of every material makes it uniquely identifiable and detectable. The manner in which this information is applied thus enables the detection of any target material. A target material can be detected and located based on a resonant, responsive RF wave and/or magnetic relationship between the target and a transmitter antenna 120 transmitting at the frequency specific and unique to the target material. The transmitter unit 106, through the transmitter antenna 120, induces a resonance due to responsive RF waves and/or magnetic and/or otherwise in a targeted material to resonate at a specific computed frequency. The receiver antenna 126 and receiver circuit 128 detect the resonance induced in the material and, in so doing, indicate the approximate line of bearing to the material. The primary method used by this detection system to detect specific materials is based on tuning the circuit 108 of the transmitter unit 106 to a specific value that is computed for the material of interest. The frequency can be based on any of the three defining characteristics of the material, the number of protons, the number of neutrons, or the atomic mass, such as the sum of protons and neutrons and combinations thereof. The frequency can be transmitted at varying voltages to compensate for other external effects or interference. In some embodiments, a table or database of characteristics of common materials may be used to calculate the resonant frequencies. To accomplish this tuning, the frequency of the signal from the transmitter antenna 120 is set to some harmonic of the elements of the material. The detection module 152 may record the time the signal was received. This can be compared to the time the signal was transmitted to calculate a time-of-flight. The receiver antenna 126 may have multi-point detection capabilities in order to triangulate the location of the responding material. The detection module 152 may command at step 310 the receiver unit 124 to process the RF signal. The receiver unit 124 processes the received RF signal to extract meaningful data that can be analyzed for the presence of specific materials, which may involve further amplification, filtering, digitization, and initial data processing before the signal is sent to the control panel 146 for detailed analysis. In some embodiments, after the RF signal is received and initially amplified, it may require further amplification to ensure the signal is at an optimal level for processing. In some embodiments, an additional RF amplifier within the receiver unit 124 may boost the signal strength while maintaining its integrity. The amplified signal may be subjected to more advanced filtering by the filter circuit, which removes any residual noise and unwanted frequencies that might have passed through the initial filtering stage. In some embodiments, the filtering may involve bandpass filters that allow only the desired frequency range to pass through. The filtered analog signal may be converted into a digital format using an Analog-to-Digital Converter, ADC. The ADC samples the analog signal at a high rate and converts it into a series of digital values. The digitized signal may be processed using digital techniques. The digital signal may be fed into a Digital Signal Processor, DSP, within the receiver unit 124. In some embodiments, the DSP may perform initial data processing tasks such as demodulation, noise reduction, and feature extraction. Demodulation involves extracting the original information-bearing signal from the carrier wave. Noise reduction techniques may further clean the signal, making it easier to analyze. Feature extraction may involve identifying characteristics of the signal that are indicative of the presence of target materials. The detection module 152 may command at step 312 the receiver unit 124 to send the output to the base module 150. The resultant data from the process is organized and packaged, which may involve structuring the data into packets, adding metadata such as timestamps and identifiers, and incorporating error-checking codes to ensure data integrity during transmission. The data may be a binary indication of whether or not a resonance response was detected by the receive antenna 126. Alternatively, some or all of the received signal data may be sent to the base module 150. The detection module 152 may return at step 314 to the base module 150.

Figures 4, 5, 6:
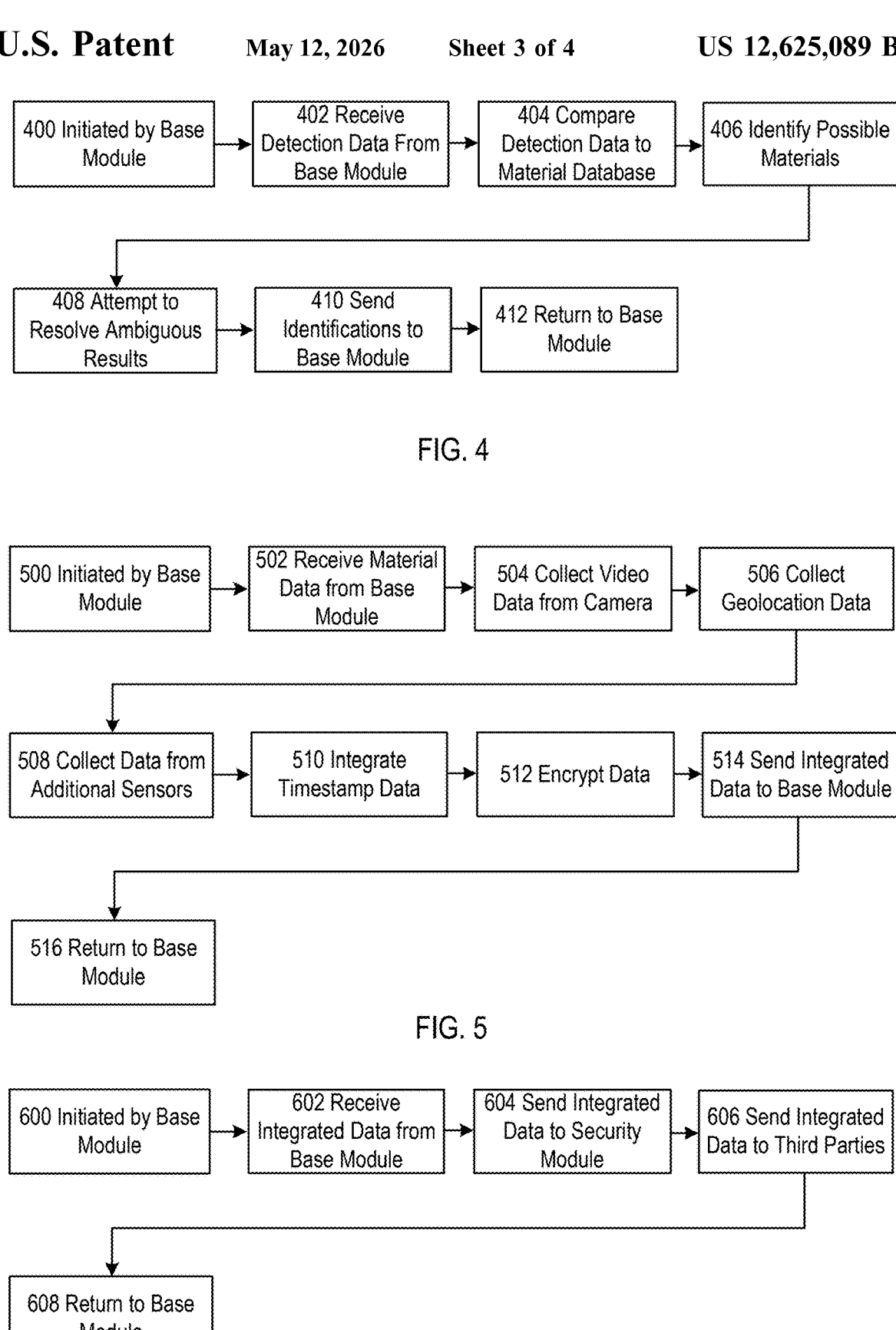
FIG. 4 is a flow chart of a method performed by a Determination Module, according to an embodiment.
FIG. 5 is a flow chart of a method performed by a Data Integration Module, according to an embodiment.
FIG. 6 is a flow chart of a method performed by a Reporting Module, according to an embodiment.

FIG. 4 displays the determination module 156. The determination module 154 may be initiated at step 400 by the base module 150. The determination module 154 may receive at step 402 detection data from the base module 150.

This may be a list of which selected frequencies produced any response at all or a data table of selected frequencies and their associated received resonance response. The determination module 154 may compare at step 404 the detection data to the material database 160. For example, if the detection data showed a response at 800 Hz, 2271 Hz, and 2972 Hz, then the determination module 154 would search the material database 160 for any entries with those frequencies. The determination module 154 may identify at step 406 the possible materials in the sample. These would be any materials or elements that have resonant frequencies that correspond to the frequencies in the detection data. For example, given that there was a response at the frequencies 800 Hz, 2271 Hz, and 2972 Hz, then the possible materials detected would be Ammonium Nitrate, Nitroglycerin, and Nitrocellulose based on the data in the material database 160. The determination module 154 may attempt at step 408 to resolve any ambiguous results. Since some materials may share similar features, such as total atomic weight or number of protons, they may have similar or the same resonant frequencies. In ambiguous cases, the determination module 154 may be able to identify which material is present based on the materials' other resonance frequencies. For example, Nitrocellulose and Cocaine are very close in their resonant frequencies. The determination module 154 may check to see if there are additional frequencies that either compound resonates at. For example, Nitrocellulose may also resonate at 1520 Hz. The determination module 154 may send at step 410 all identified materials and/or elements to the base module 150. If the results are ambiguous, the determination module 154 may further send to the base module 150 a confidence score or interval for each possible material. For example, the determination module 154 may be 95% confident that Nitrocellulose was detected, with the other 5% being a material with a similar resonance frequency that is not in the material database 160. The determination module 154 may return at step 412 to the base module 150.

FIG. 5 displays the data integration module 156. The data integration module 156 may be initiated at step 500 by the base module 150. The data integration module 156 may receive at step 502 material data from the base module 150. Material data may include the identity of each material, the signal strength of the response, and the confidence interval that the identification is correct. For example, the material data may indicate a 95% confident identification of Nitrocellulose at a signal strength of −2 dB. The data integration module 156 may collect at step 504 video data from the camera 162 that corresponds to the time of the material detection. The data integration module 156 may also collect the video data leading up to the detection and following the detection to give a more comprehensive view. For example, the video may show a person walking through an airport security screening 30 seconds before Nitrocellulose was detected on the person and then 30 seconds after. The data integration module 156 may collect at step 506 geolocation data from the geolocation sensors 164 that corresponds to the time of the material detection. For example, the geolocation data may contain the geolocation of JFK Airport or a border crossing between the U.S. and Mexico. The data integration module 156 may collect at step 508 data from any additional sensors 166. This may include motion data, temperature data, humidity data, sound data, thermal image data, or any other data which may be relevant to law enforcement or evidence collection. The data integration module 156 may integrate at step 510 all of the received and collected data. This data may also be timestamped. The timestamp may reflect the time of the material detection, the time of the data integration, or both. For example, integrated data may indicate that at 9:34 AM at JFK Airport, Nitrocellulose was detected with a 95% confidence interval and a signal strength of –2 dB. A video and audio recording of a person suspected of carrying the Nitrocellulose is included in the data. Humidity and temperature were normal and, therefore, unlikely to affect the readings of the RF detection device 102. The data integration module 156 may encrypt at step 512 the integrated data using a secure encryption method such as AES or DSA. The data may be encrypted for privacy and security but also to prevent users of the system from tampering with evidence. The data integration module 156 may send at step 514 the integrated data to the base module 150. The data integration module 156 may return at step 516 to the base module 150.

FIG. 6 displays the reporting module 158. The reporting module 158 may be initiated at step 600 by the base module 150. The reporting module 158 may receive at step 602 integrated data from the base module 150. For example, the base module 150 may send data that indicates that at 9:34 AM at JFK Airport, Nitrocellulose was detected with a 95% confidence interval and a signal strength of –2 dB. A video and audio recording of a person suspected of carrying the Nitrocellulose is included in the data. Humidity and temperature were normal and, therefore, unlikely to affect the readings of the RF detection device 102. The reporting module 158 may send at step 604 the data to the security module 176 of the security network 174 via the cloud 172. The reporting module 158 may also send a means of decrypting the data, such as using Public-Key Cryptography. The reporting module 158 may send at step 606 the data to various third parties via the cloud 172. These third parties may keep a record of the data in order to verify the data at a later time. Ideally, multiple independent third parties should be sent the integrated data so that if one party manipulates the data, various other parties can challenge the manipulated data with their version of the original data. In some embodiments, the data may even be recorded on a blockchain ledger system for even further decentralization. This step increases the likelihood that the integrated data may be admissible in an evidentiary proceeding such as a court hearing. The reporting module 158 may return at step 608 to the base module 150.

Figures 7, 8:
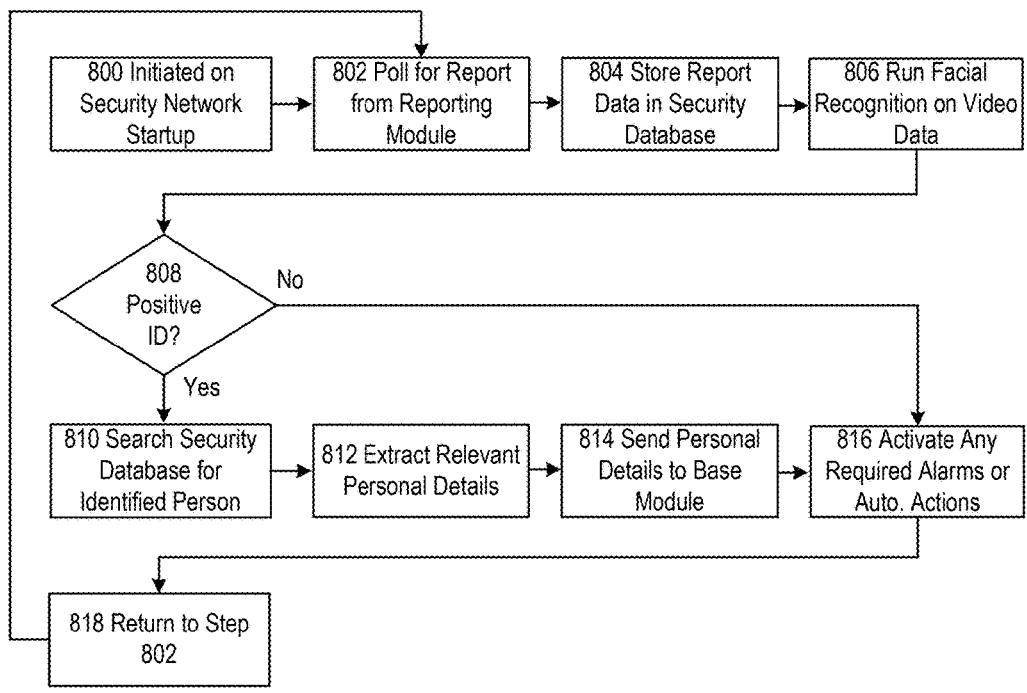
FIG. 7 illustrates a Material Database, according to an embodiment.
FIG. 8 is a flow chart of a method performed by a Security Module, according to an embodiment.

FIG. 7 displays the material database 160. The material database 160 may contain a list of materials and their associated resonance frequencies. These resonance frequencies are the frequencies of electromagnetic waves emitted from the transmitter antenna 120 that produce a response from the material that can be received by the receiver unit 124. The frequency at which an element resonates may be based on the number of protons, number of neutrons, and/or atomic mass (sum of protons and neutrons) for the element. For example, the selected frequencies for Chlorine Gas (Cl2) may be 34 Hz (based on the number of protons), 36 Hz (based on the number of neutrons), and 70 Hz (based on atomic mass). These frequencies can also be increased by one or more orders of magnitude (10×, 100×, etc.). Similarly, the frequencies for a material may be based on the sum total of the constituent parts. For example, a Hydrogen Peroxide (H2O2) molecule has a combined total of 18 protons (corresponding to a frequency of 18 or 180 Hz) and a mass of 34 (corresponding to a frequency of 34 or 340 Hz). Individual scans using two or more of these frequencies can be used to uniquely identify the element or material. Note that these frequencies are examples. The actual frequencies at which materials and elements resonate may be determined by physics models and/or experimentation. The material database may further contain priority tiers for specific applications. These priority tiers may determine in which order frequencies are selected for testing. For example, application A may be an airport security application wherein, Ammonium Nitrate and Nitroglycerin might be high priority due to being explosive. Cocaine is illegal but unlikely to cause mass harm on a crowded airplane, so it is a lower priority. For another example, application B may be a border crossing station wherein Cocaine and Heroin are high priority due to being commonly smuggled illegal drugs. Acetone, while it can be used to create explosives, is not a high priority as it has many legal uses, and border checkpoints are not high density population centers like airports.

FIG. 8 displays the security module 176. The security module 176 may be initiated at step 800 when the security network 174 is initialized. The security module 176 may constantly run as long as the security network 174 is active. Alternatively, the security network 174 may initiate and terminate the security module 176 when appropriate. The security module 176 may poll at step 802 for a report from the reporting module 158. The report may contain integrated data from the RF detection device 102. For example, the data may indicate that at 9:34 AM at JFK Airport, Nitrocellulose was detected with a 95% confidence interval and a signal strength of –2 dB. A video and audio recording of a person suspected of carrying the Nitrocellulose is included in the data. Humidity and temperature were normal and, therefore, unlikely to affect the readings of the RF detection device 102. The security module 176 may store at step 804 the integrated data from the report in the security database 178. The security module 176 may run at step 806, a facial recognition process on the video data in the integrated data using the facial recognition system 180. Other identification processes may also be used, such as voice identification on sound data. Facial identification data may also be stored in the security database 178. The security module 176 may determine at step 808 if there is a positive identification of a person. If the facial recognition system 180 was unable to identify a person from the video data, the security module 176 may skip to step 816. If there is a positive identification, the security module 176 may search at step 810, the security database 178 for personal information on the identified person. This may include demographic data, criminal records, historical incidents, government issued IDs, or any other data which may be important for security personnel to know. The security module 176 may extract at step 812 the relevant personal details from the security database 178. For example, the identified person carrying Nitrocellulose may have outstanding warrants for unlicensed carry of a firearm or otherwise be included in a list of individuals being sought by law enforcement. The security module 176 may send at step 814 the personal details to the base module 150 of the RF detection device 102 via the cloud 172. The security module 176 may activate at step 816 any alarms or automatic actions based on the integrated data. For example, when Nitrocellulose is detected at a signal strength above –5 dB, the Airport's security network 174 may automatically inform the Air Marshals. These actions may also include sending additional data to the base module 150, such as instructions on how to handle dangerous individuals and/or dangerous materials. Other embodiments may include transportation security at airports where the system is triggered when passengers and their luggage pass through security checkpoints. The system may scan for specific resonance frequencies associated with dangerous materials, and if detected, it may alert security personnel through a detailed report including the type of material detected, its location, and the time of detection. This report may prompt a manual search and further investigation or detainment of the individual. For VIP protection at public events, the system may be activated prior to and during the arrival of VIPs at event locations or vehicles. The area may be scanned for unauthorized devices or explosives, and if a threat is detected, the system may generate a security alert with details about the detected material and its precise location, allowing for immediate evacuation or neutralization. This report may also trigger increased surveillance and further sweeps of the area. In the context of border control at entry points, the system may be triggered by the arrival of cargo or vehicles at border checkpoints. It may scan incoming goods for illegal substances or materials not declared, and upon detection, a report may be sent to border control officials detailing the type of material, its quantity, and the carrier's information. This report can lead to the seizure of goods, further legal action, or fines, and helps in tracking and preventing smuggling activities. The security module 176 may return at step 818 to step 802.

The functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

What is claimed is:

1. A machine-implemented method for materials detection-based security, the method comprising:

transmitting an RF signal via a radio frequency (RF) transmitter into a target object at a first resonance frequency specified by stored information in a material database for a material;

receiving a response signal from the target object via an RF receiver in response to the RF signal; and detecting one or more materials present in the target object by determining that the response signal exhibits one or more resonance characteristics associated with each of the identified materials;

integrating data regarding the detected materials with sensor data captured by one or more sensors at a time associated with a time of detection; and generating a report for display on a graphical display screen, the report including the data regarding each detected material in the target object integrated with the sensor data.

2. The machine-implemented method of claim 1, further comprising encrypting the report using a first encryption method.

3. The machine-implemented method of claim 2, further comprising transmitting the encrypted report to at least one of a security network or one or more third party systems.

4. The machine-implemented method of claim 1, wherein the sensors include one or more of a motion sensor, a temperature sensor, a microphone, a thermal imager, a radar device, a lidar device, an ultrasound device, a speaker, or a wearable device.

5. The machine-implemented method of claim 1, wherein the report includes at least one of a signal strength of the response signal as measured by the RF receiver or a confidence level of identification as calculated by the at least one processor.

6. The machine-implemented method of claim 1, wherein the stored information in the material database further includes a priority of detecting each material of a plurality of materials for one or more applications, and wherein the RF signal is transmitted for each material in order of the priority for a specific application.

7. The machine-implemented method of claim 6, wherein at least a subset of the plurality of materials is selected by a user.

8. The machine-implemented method of claim 1, further comprising:

determining that no materials are identified or ambiguous resonance characteristics are detected; and using a second resonance frequency for material as specified by the stored information in the material database.

9. The machine-implemented method of claim 1, further comprising:

performing facial recognition on image or video data in the sensor data;

determining that the image or video data is of a person as positively identified by the facial recognition; and storing personal details of the identified person in a security database.

10. The machine-implemented method of claim 9, determining that the identified person is included in a list of individuals, and initiating an alarm or another automatic action.

11. A material detection and identification system for materials detection-based security, the system comprising:

a radio frequency (RF) transmitter configured to transmit an RF signal into the target object at a first resonance frequency specified by stored information in a material database for a material;

an RF receiver configured to receive a response signal from the target object in response to the RF signal; and at least one processor configured to execute instructions stored in memory, wherein the at least one processor executes the instructions to:

detect one or more materials present in the target object by determining that the response signal exhibits one or more resonance characteristics associated with each of the identified materials;

integrate data regarding the detected materials with sensor data captured by one or more sensors at a time associated with a time of detection; and generate a report for display on a graphical display screen, the report including the data regarding each detected material in the target object integrated with the sensor data.

12. The system of claim 11, wherein the at least one processor executes further instructions to encrypt the report using a first encryption method.

13. The system of claim 12, wherein the at least one processor executes further instructions to initiate transmission via a communication interface of the encrypted report to at least one of a security network or one or more third party systems.

14. The system of claim 11, wherein the sensors include one or more of a motion sensor, a temperature sensor, a microphones, a thermal imager, a radar device, a lidar device, an ultrasound device, a speaker, or a wearable device.

15. The system of claim 11, wherein the report includes at least one of a signal strength of the response signal or a confidence level of identification.

16. The system of claim 11, wherein the stored information in the material database further includes a priority of detecting each material of a plurality of materials for one or more applications, and wherein the RF transmitter is configured to transmit the RF signal for each material in order of the priority for a specific application.

17. The system of claim 11, wherein at least a subset of the plurality of materials is selected by a user.

18. The system of claim 11, further comprising determining that no materials are identified or ambiguous resonance characteristics are detected, wherein the RF transmitter uses a second resonance frequency for the material as specified by the stored information in the material database.

19. The system of claim 11, wherein the at least one processor executes further instructions to:

perform facial recognition on the image or video data in the sensor data; and determining that the image or video data is of a person as positively identified by the facial recognition; and further comprising a security database in memory configured to store personal details of the identified person.

20. The system of claim 19, wherein the at least one processor executes further instructions to determine that the identified person is included in a list of individuals and to initiate an alarm or another automatic action.

\* \* \* \* \*